(12) United States Patent
Sunayama et al.

(10) Patent No.: US 8,497,208 B2
(45) Date of Patent: Jul. 30, 2013

(54) SEMICONDUCTOR DEVICE AND METHOD FOR MANUFACTURING THE SAME

(75) Inventors: Michie Sunayama, Kawasaki (JP); Yoshiyuki Nakao, Kawasaki (JP); Noriyoshi Shimizu, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 422 days.

(21) Appl. No.: 12/883,701

(22) Filed: Sep. 16, 2010

(65) Prior Publication Data

US 2011/0003475 A1 Jan. 6, 2011

Related U.S. Application Data

(62) Division of application No. 12/369,297, filed on Feb. 11, 2009, now Pat. No. 7,816,279.

(30) Foreign Application Priority Data

Feb. 12, 2008 (JP) ................. 2008-030314

(51) Int. Cl.
*H01L 21/44* (2006.01)

(52) U.S. Cl.
USPC ........... 438/685; 438/761; 438/687; 438/513; 257/E21.006; 257/E21.054; 257/E21.17; 257/E21.152; 257/E21.248; 257/E21.267; 257/E21.278; 257/E21.293; 257/E21.311; 257/E21.318; 257/E21.304

(58) Field of Classification Search
USPC ............. 438/685, 687, 700, 722, 761, 513, 438/514; 257/E21.006, E21.054, E21.17, 257/E21.152, E21.248, E21.267, E21.278, 257/E21.293, E21.304, E21.311, E21.318
See application file for complete search history.

(56) References Cited

U.S. PATENT DOCUMENTS

| | | | |
|---|---|---|---|
| 6,229,211 B1 | 5/2001 | Kawanoue et al. | |
| 6,399,521 B1 | 6/2002 | Zhang et al. | |
| 6,518,177 B1 | 2/2003 | Kawanoue et al. | |
| 6,566,753 B2 | 5/2003 | Zhang et al. | |
| 7,157,371 B2 | 1/2007 | Hecht et al. | |
| 7,358,180 B2 | 4/2008 | Sakai et al. | |
| 7,816,279 B2 * | 10/2010 | Sunayama et al. | 438/761 |
| 2004/0232471 A1 | 11/2004 | Shukuri | |
| 2008/0073708 A1 | 3/2008 | Aiso | |

FOREIGN PATENT DOCUMENTS

| | | |
|---|---|---|
| JP | 08-172059 A | 7/1996 |
| JP | 2000-049116 A | 2/2000 |
| JP | 2000-150510 A | 5/2000 |
| JP | 2000-353787 A | 12/2000 |
| JP | 2004-153162 A | 5/2004 |
| JP | 2004-289174 A | 10/2004 |
| JP | 2005-252193 A | 9/2005 |
| WO | 2005/067025 A1 | 7/2005 |

* cited by examiner

*Primary Examiner* — David Nhu
(74) *Attorney, Agent, or Firm* — Westerman, Hattori, Daniels & Adrian, LLP

(57) ABSTRACT

A method for producing a semiconductor device including a first conductor disposed on a semiconductor substrate; an oxygen-containing insulation film disposed on the semiconductor substrate and on the first conductor, the insulation film having a contact hole which extends to the first conductor and a trench which is connected to an upper portion of the contact hole; a zirconium oxide film disposed on a side surface of the contact hole and a side surface and a bottom surface of the trench; a zirconium film disposed on the zirconium oxide film inside the contact hole and inside the trench; and a second conductor composed of Cu embedded into the contact hole and into the trench.

11 Claims, 55 Drawing Sheets

SEMICONDUCTOR DEVICE AND METHOD FOR MANUFACTURING THE SAME

CROSS-REFERENCE TO RELATED APPLICATION

This is a division of U.S. application Ser. No. 12/369,297, filed on Feb. 11, 2009, now U.S. Pat. No. 7,816,279 B2, which is based upon and claims the benefit of priority from Japanese Patent Application No. 2008-30314 filed on Feb. 12, 2008, the entire contents of which are incorporated herein by reference.

BACKGROUND

1. Field

The present invention relates to a semiconductor device and a method for manufacturing the same.

2. Description of Related Art

Recently, in order to reduce resistance of conductor plugs and interconnect lines, the use of copper (Cu) as a material for conductor plugs and interconnect lines has been receiving attention.

A Cu film is a material that is difficult to dry etch. Therefore, a method is employed in which contact holes and trenches are formed in an interlayer insulation film, a Cu film is formed on the interlayer insulation film provided with the contact holes and the trenches, and then, by polishing the Cu film until the surface of the interlayer insulation film is exposed, the Cu film is embedded into the contacts holes and the trenches. Such a method of embedding a Cu film into contact holes and trenches is referred to as a damascene process or a dual damascene process.

When conductor plugs and interconnect lines composed of Cu are directly in contact with an interlayer insulation film, Cu atoms in the conductor plugs and the interconnect lines diffuse into the interlayer insulation film, giving rise to problems, such as short-circuiting. Consequently, a barrier film for preventing the diffusion of Cu atoms is disposed in the contact holes and the trenches. As the material for the barrier film, for example, Ta is used.

Recently, in order to achieve further miniaturization of semiconductor devices, it has been required to significantly reduce the diameter of contact holes in which conductor plugs are to be embedded and the width of trenches in which interconnect lines are to be embedded. In order to significantly reduce the diameter of contact holes, it is necessary to significantly decrease the thickness of a barrier film. On the other hand, in order to increase the speed of semiconductor devices, it has been required to decrease the capacitance between interconnect lines. Recently, as an insulation film that can decrease the capacitance between interconnect lines, a low-dielectric-constant film composed of a porous material has been proposed.

However, when the thickness of a barrier film composed of Ta or the like is significantly decreased, the barrier properties of the barrier film are degraded. In particular, large amounts of moisture and oxygen gas are released from an interlayer insulation film composed of a porous material. Consequently, when such an interlayer insulation film composed of a porous material is used, the barrier film is significantly degraded by moisture, oxygen gas, etc.

SUMMARY

According to an aspect of an embodiment, a semiconductor device includes a first conductor disposed on a semiconductor substrate; an oxygen-containing insulation film disposed on the semiconductor substrate and on the first conductor, the insulation film having a contact hole which extends to the first conductor and a trench which is connected to an upper portion of the contact hole; a zirconium oxide film disposed on a side surface of the contact hole and a side surface and a bottom surface of the trench; a zirconium film disposed on the zirconium oxide film inside the contact hole and inside the trench; and a second conductor composed of Cu embedded into the contact hole and into the trench.

DETAILED DESCRIPTION

First Embodiment

A semiconductor device and a method for manufacturing the same according to a first embodiment of the present invention will be described with reference to FIGS. 1, 2A to 2T, and 3A to 3L.

(Semiconductor Device)

Figure 1:
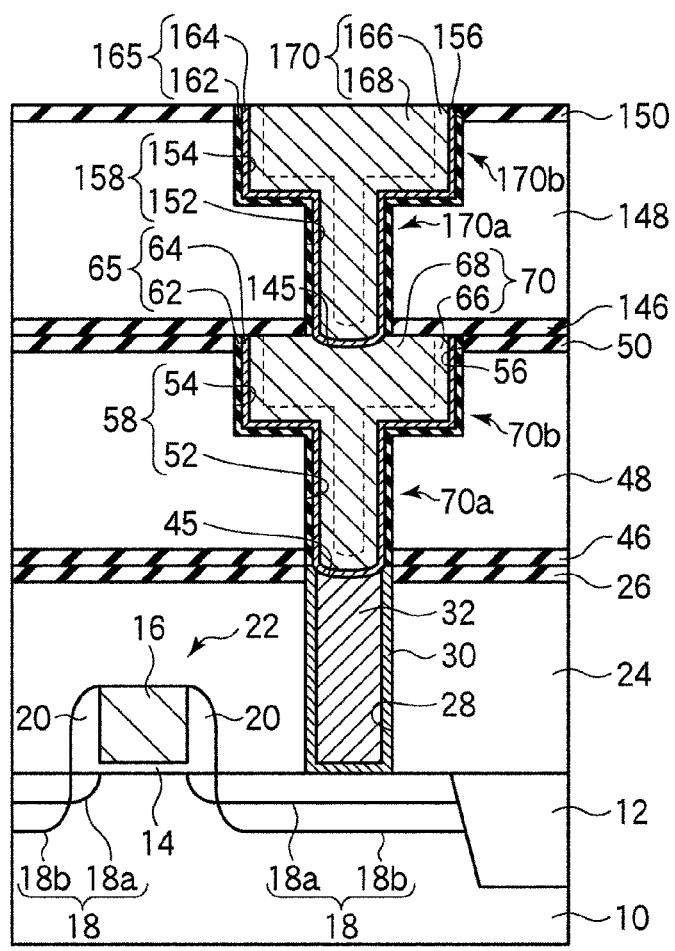
FIG. 1 is a cross-sectional view of a semiconductor device according to a first embodiment.

First, a semiconductor device according to this embodiment will be described with reference to FIG. 1. FIG. 1 is a cross-sectional view of the semiconductor device according to this embodiment.

Referring to FIG. 1, an element isolation region 12, which defines an element region, is disposed in a semiconductor substrate 10, for example, composed of silicon.

In the element region defined by the element isolation region 12, a gate electrode 16 is disposed on the substrate 10 with a gate insulating film 14 having a thickness of 1.3 nm therebetween.

Shallow impurity diffusion regions 18a constituting shallow regions of an extension source/drain structure, i.e., extension regions, are disposed in the semiconductor substrate 10 at both sides of the gate electrode 16.

A sidewall insulation film 20 composed of a silicon oxide film is disposed on a sidewall portion of the gate electrode 16.

Deep impurity diffusion regions 18b constituting deep regions of the extension source/drain structure are disposed in the semiconductor substrate 10 at both sides of the gate electrode 16 provided with the sidewall insulation film 20. The shallow impurity diffusion regions 18a and the deep impurity diffusion regions 18b constitute source/drain diffusion layers 18 of the extension source/drain structure.

Thus, a transistor 22 having the gate electrode 16 and the source/drain diffusion layers 18 is provided.

An insulation film 24 is disposed on the semiconductor substrate 10. The thickness of the insulation film 24, is for example, 150 nm. As the insulation film 24, for example, a silicon oxide film or a porous low-dielectric-constant film is used. Here, as the insulation film 24, for example, a methylsilsesquioxane film is used.

A cap film 26, for example, composed of SiC is disposed on the interlayer insulation film 24. The thickness of the cap film 26 is, for example, about 30 nm.

A contact hole 28 that extends to the source/drain diffusion layer 18 is provided in the cap film 26 and the interlayer insulation film 24.

A barrier metal film 30, for example, composed of TiN is disposed in the contact hole 28. Such a barrier metal film 30 is formed, for example, by an atomic layer deposition (ALD) process. The thickness of the barrier metal film 30 is, for example, 3 nm.

A conductor plug 32, for example, composed of tungsten is embedded in the contact hole 28 provided with the barrier metal film 30.

A cap film 46, for example, composed of SiC is disposed on the cap film 26 embedded with the conductor plug 32. The thickness of the cap film 46 is, for example, about 30 nm. The cap film 46 serves as an etching stopper during the etching of an interlayer insulation film 48.

The interlayer insulation film 48, for example, composed of a porous low-dielectric-constant film is disposed on the cap film 46. The thickness of the interlayer insulation film 48 is, for example, 120 nm. As the interlayer insulation film 48, an organic low-dielectric-constant film may be used, or an inorganic low-dielectric-constant film may be used. As the material for the organic low-dielectric-constant film, for example, SiLK (registered trademark) can be used. As the inorganic low-dielectric-constant film, for example, a methylsilsesquioxane (MSQ) film or a SiOCH film can be used.

A cap film 50, for example, composed of SiC is disposed on the interlayer insulation film 48. The thickness of the cap film 50 is, for example, about 30 nm. The cap film 50 serves as a hard mask during the etching of the interlayer insulation film 48.

A contact hole 52 that extends to the conductor plug 32 is provided in the interlayer insulation film 48 and the cap films 50 and 26. A conductor plug 70a is to be embedded into the contact hole 52. The diameter of the contact hole 52 is, for example, about 50 nm. The contact hole 52 has a recessed portion 45 at the bottom thereof, the recessed portion 45 being located on the top of the conductor plug 32. The depth of the recessed portion 45 is, for example, about 3 nm.

A trench 54 connected to the upper portion of the contact hole 52 is provided in the cap film 50 and the interlayer insulation film 48. An interconnect line 70b is to be embedded into the trench 54. The width of the trench 54 is, for example, about 50 nm to 3 μm.

Thus, an opening 58 having the contact hole 52 and the trench 54 connected to the upper portion of the contact hole 52 is provided.

A zirconium oxide ($ZrO_2$) film 62 is disposed in the opening 58. The thickness of the zirconium oxide film 62 is, for example, about 3 nm. More specifically, the zirconium oxide film 62 is disposed on the side surface of the contact hole 52 and the side surface and the bottom surface of the trench 54.

The zirconium oxide film 62 at the bottom of the contact hole 52 is selectively removed. The reason for selectively removing the zirconium oxide film 62 at the bottom of the contact hole 52 is in order to achieve good contact between the conductor plug 70a and the conductor plug 32.

A zirconium (Zr) film 64 is disposed in the opening 58 provided with the zirconium oxide film 62. The thickness of the Zr film 64 is about 2 nm. Since the zirconium oxide film 62 at the bottom of the contact hole 52 is removed, the Zr film 64 at the bottom of the contact hole 52 is directly connected to the conductor plug 32. Consequently, good contact can be obtained between the conductor plug 70a and the conductor plug 32. Furthermore, the Zr film 64 contributes to ensuring adhesion of the conductor plug 70a and the interconnect line 70b to the base.

Thus, a barrier film 65 including the zirconium oxide film 62 and the Zr film 64 is provided.

A seed film 66 composed of Cu is disposed in the opening 58 provided with the barrier film 65. The thickness of the seed film 66 is, for example, about 30 nm.

A Cu film 68 is embedded into the opening 58 provided with the seed film 66.

Thus, a conductor 70 including the seed film 66 composed of Cu and the Cu film 68 is embedded into the opening 58. That is, the conductor 70 having the conductor plug 70a and the interconnect line 70b integrally formed with the conductor plug 70a is embedded into the opening 58.

A cap film 146, for example, composed of SiC is disposed on the interlayer insulation film 48 embedded with the conductor 70. The thickness of the cap film 146 is, for example, about 30 nm. The cap film 146 serves as an etching stopper during the etching of an interlayer insulation film 148.

The interlayer insulation film 148, for example, composed of a porous low-dielectric-constant film is disposed on the cap film 146. The thickness of the interlayer insulation film 148 is, for example, 140 nm. As the interlayer insulation film 148, an organic low-dielectric-constant film may be used, or an inorganic low-dielectric-constant film may be used. As the material for the organic low-dielectric-constant film, for example, SiLK (registered trademark) can be used. As the inorganic low-dielectric-constant film, for example, a methylsilsesquioxane (MSQ) film or a SiOCH film can be used.

A cap film 150, for example, composed of SiC is disposed on the interlayer insulation film 148. The thickness of the cap film 150 is, for example, about 30 nm. The cap film 150 serves as a hard mask during the etching of the interlayer insulation film 148.

A contact hole 152 that extends to the conductor 70 is provided in the interlayer insulation film 148 and the cap film 150. More specifically, the contact hole 152 which extends to the interconnect line 70b is provided in the interlayer insulation film 148 and the cap film 150. A conductor plug 170a is to be embedded into the contact hole 152. The contact hole 152 has a recessed portion 145 at the bottom thereof, the recessed portion 145 being located on the top of the interconnect line 70b. The depth of the recessed portion 145 is, for example, about 3 nm.

A trench 154 connected to the upper portion of the contact hole 152 is provided in the cap film 150 and the interlayer insulation film 148. An interconnect line 170b is to be embedded into the trench 154.

Thus, an opening 158 having the contact hole 152 and the trench 154 connected to the upper portion of the contact hole 152 is provided.

A zirconium oxide film 162 is disposed in the opening 158. The thickness of the zirconium oxide film 162 is, for example, about 3 nm. More specifically, the zirconium oxide film 162 is disposed on the side surface of the contact hole 152 and the side surface and the bottom surface of the trench 154. The zirconium oxide film 162 at the bottom of the contact hole 152 is selectively removed. The reason for selectively removing the zirconium oxide film 162 at the bottom of the contact hole 152 is in order to achieve good contact between the conductor plug 170a and the interconnect line 70b.

A zirconium film 164 is disposed in the opening 158 provided with the zirconium oxide film 162. The thickness of the Zr film 164 is about 2 nm. Since the zirconium oxide film 162 at the bottom of the contact hole 152 is removed, the Zr film 164 at the bottom of the contact hole 152 is directly connected to the interconnect line 70b. Consequently, good contact can be obtained between the conductor plug 170a and the interconnect line 70b. Furthermore, the Zr film 164 contributes to ensuring adhesion of the conductor plug 170a and the interconnect line 170b to the base.

Thus, a barrier film 165 including the zirconium oxide film 162 and the Zr film 164 is provided.

A seed film 166 composed of Cu is disposed in the opening 158 provided with the barrier film 165. The thickness of the seed film 166 is, for example, about 30 nm.

A Cu film 168 is embedded into the opening 158 provided with the seed film 166.

Thus, a conductor 170 including the seed film 166 composed of Cu and the Cu film 168 is embedded into the opening 158. That is, the conductor 170 having the conductor plug 170a and the interconnect line 170b integrally formed with the conductor plug 170a is embedded into the opening 158.

An interconnect line (not shown) is further disposed on the cap film 150 embedded with the conductor plug 170a and the interconnect line 170b.

A semiconductor device having a multilayer interconnection structure according to this embodiment has the structure described above.

According to this embodiment, the barrier film 65 is composed of a laminate including the zirconium oxide film 62 and the Zr film 64, and the barrier film 165 is composed of a laminate including the zirconium oxide film 162 and the Zr film 164. The zirconium oxide films 62 and 162, even with a very small thickness, can reliably prevent the diffusion of Cu, oxygen, moisture, etc. Furthermore, the Zr films 64 and 164 contribute to ensuring adhesion of the conductor plug 70a or 170a and the interconnect line 70b or 170b to the base. Furthermore, because of its good conductivity, the Zr film 64 contributes to a decrease in contact resistance between the conductor plug 70a and the conductor plug 32. Furthermore, because of its good conductivity, the Zr film 164 contributes to a decrease in contact resistance between the conductor plug 170a and the interconnect line 70b. Consequently, according to this embodiment, high-quality barrier films 65 and 165 can be formed at a small thickness without degrading reliability or manufacturing yield, and furthermore, miniaturization of the conductor plugs 70a and 170a and the interconnect lines 70b and 170b can be realized.

Moreover, the zirconium oxide films 62 and 162 are not easily degraded by moisture, oxygen, etc. Therefore, even if large amounts of moisture, oxygen, etc. are released from the interlayer insulation film 48 or 148, the barrier properties of the zirconium oxide film 62 or 162 are not degraded. Consequently, according to this embodiment, a porous low-dielectric-constant insulation film containing relatively large amounts of oxygen, moisture, etc. can be used as each of the interlayer insulation films 48 and 148.

(Method for Manufacturing Semiconductor Device)

Figure 2A:
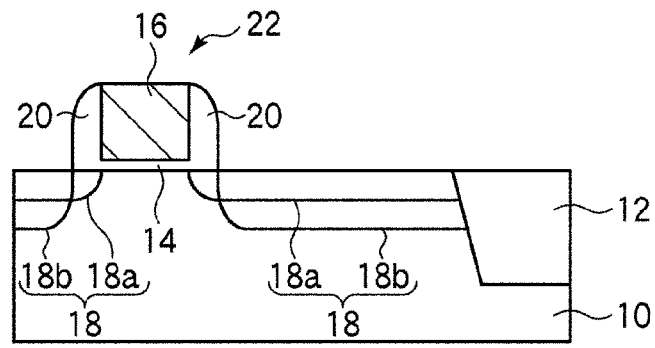
FIGS. 2A to 2T are cross-sectional views showing the steps in a method for manufacturing a semiconductor device according to the first embodiment.

A method for manufacturing a semiconductor device according to this embodiment will now be described with reference to FIGS. 2A to 2T. FIGS. 2A to 2T are cross-sectional views showing the steps in the method for manufacturing a semiconductor device according to this embodiment.

First, as shown in FIG. 2A, an element isolation region 12 which defines an element region is formed in a semiconductor substrate 10, for example, composed of silicon. The element isolation region 12 can be formed, for example, by a shallow trench isolation (STI) process.

Next, a gate insulating film 14 with a thickness of 1.3 nm is formed over the entire surface. The gate insulating film 14 can be formed, for example, by thermal oxidation.

Next, a polysilicon film with a thickness of 100 nm is formed over the entire surface. Then, the polysilicon film is patterned into a shape of a gate electrode 16 using photolithography. When the polysilicon film is patterned, for example, anisotropic dry etching is used. Thereby, the gate electrode 16 composed of polysilicon is formed.

Next, a dopant impurity is introduced into the semiconductor substrate 10 at both sides of the gate electrode 16, for example, by an ion implantation process, using the gate electrode 16 as a mask. Thereby, shallow impurity diffusion regions 18a constituting the shallow regions of an extension source/drain structure, i.e., extension regions, are formed in the semiconductor substrate 10 at both sides of the gate electrode 16.

Next, a silicon oxide film with a thickness of 10 nm is formed over the entire surface, for example, by CVD.

Next, the silicon oxide film is subjected to anisotropic etching. Thereby, a sidewall insulation film 20 composed of a silicon oxide film is formed on the sidewall portion of the gate electrode 16.

Next, a dopant impurity is introduced into the semiconductor substrate 10, for example, by an ion implantation process, using the gate electrode 16 and the sidewall insulation film 20 as a mask. Thereby, impurity diffusion regions 18b constituting the deep regions of the extension source/drain structure are formed in the semiconductor substrate 10 at both sides of the gate electrode 16 provided with the sidewall insulation film 20 on the sidewall portion thereof. The shallow impurity diffusion regions 18a and the deep impurity diffusion regions 18b constitute source/drain diffusion layers 18 of the extension source/drain structure.

Next, heat treatment for activating the dopant impurities introduced into the source/drain diffusion layers 18 is carried out, for example, by rapid thermal annealing (RTA).

Thereby, a transistor 22 having the gate electrode 16 and the source/drain diffusion layers 18 is formed.

Figure 2B:
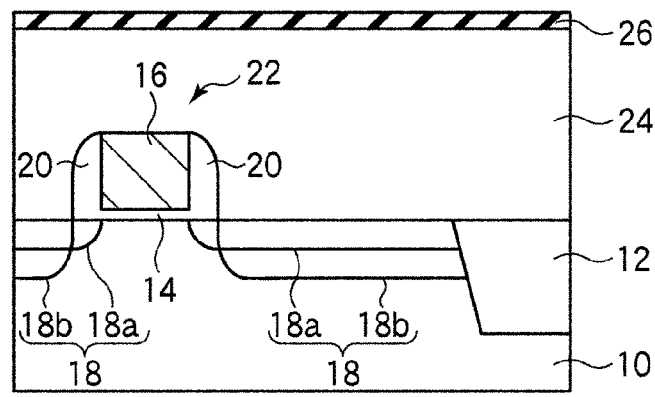

Next, as shown in FIG. 2B, an insulation film 24, for example, composed of a porous low-dielectric-constant film is formed over the entire surface, for example, by spin coating. As the insulation film 24, for example, a methylsilsesquioxane film is formed. The thickness of the insulation film 24 is, for example, 150 nm.

Next, a cap film 26, for example, composed of SiC is formed over the entire surface, for example, by CVD. The thickness of the cap film 26 is, for example, about 30 nm.

Figure 2C:
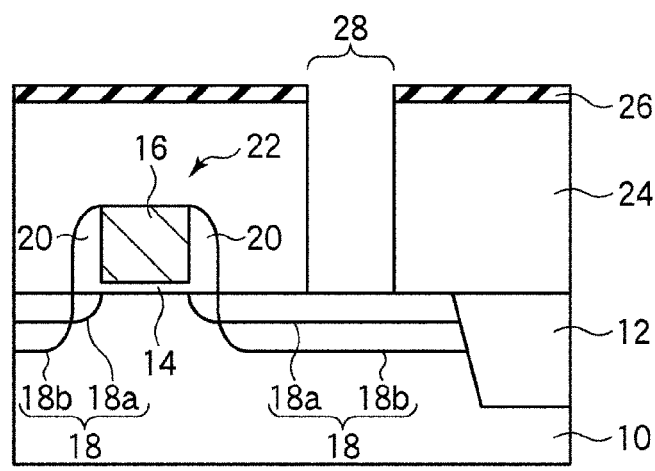

Next, using photolithography, a contact hole 28 extending to the source/drain diffusion layer 18 is formed in the cap film 26 and the interlayer insulation film 24 (refer to FIG. 2C).

Next, a barrier metal film 30, for example, composed of TiN is formed over the entire surface, for example, by an ALD process. The thickness of the barrier metal film 30 is, for example, 3 nm.

Next, a conductive film 32, for example, composed to tungsten, is formed over the entire surface, for example, by CVD. The thickness of the conductive film 32 is, for example 150 nm.

Figure 2D:
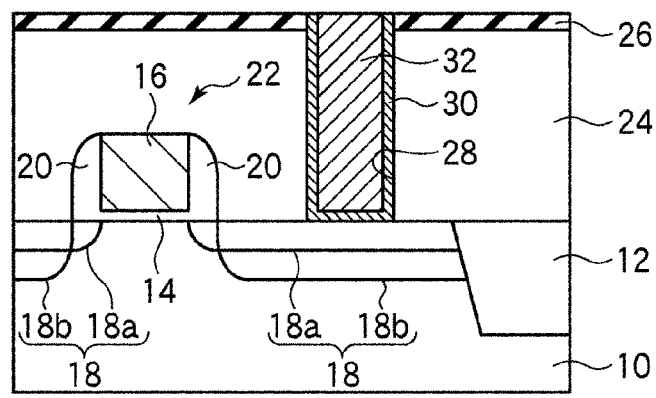

Next, the conductive film 32 is polished, for example, by chemical mechanical polishing (CMP) until the surface of the cap film 26 is exposed. A conductive plug 32 composed of tungsten is embedded into the contact hole 28 (refer to FIG. 2D).

Next, a cap film 46, for example, composed of SiC is formed over the entire surface, for example, by CVD. The thickness of the cap film 46 is, for example, about 30 nm. The cap film 46 serves as an etching stopper during the etching of an interlayer insulation film 48.

Next, the interlayer insulation film 48, for example, composed of a porous low-dielectric-constant film is formed over the entire surface. The thickness of the interlayer insulation film 48 is, for example, 120 nm. As the interlayer insulation film 48, an organic low-dielectric-constant film may be used, or an inorganic low-dielectric-constant film may be used. As the material for the organic low-dielectric-constant film, for example, SiLK (registered trademark) can be used. As the inorganic low-dielectric-constant film, for example, a methylsilsesquioxane film or a SiOCH film can be used.

Figure 2E:
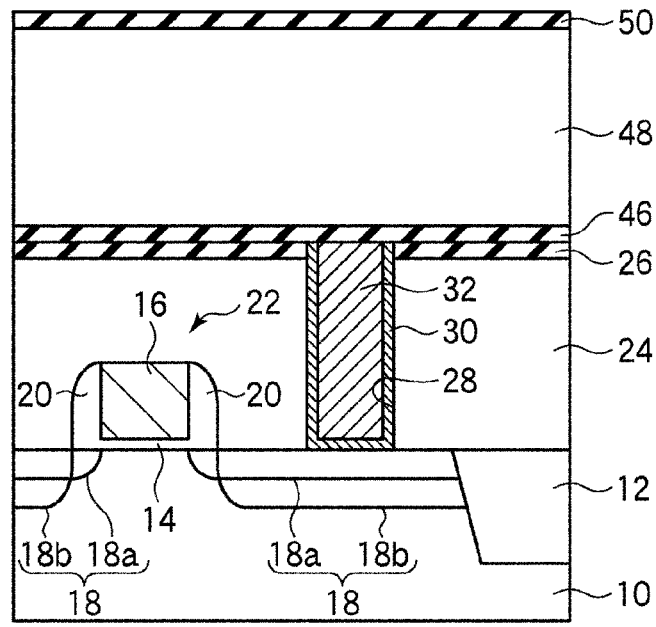

Next, a cap film 50, for example, composed of SiC is formed over the entire surface, for example, by CVD. The thickness of the cap film 50 is, for example, about 30 nm. The cap film 50 serves as a hard mask during the etching of the interlayer insulation film 48 (refer to FIG. 2E).

Next, using photolithography, the cap film 50 is subjected to patterning. Thereby, an opening (not shown) for forming a contact hole 52 is formed in the cap film 50. Thereby, a hard mask 50 composed of SiC is formed.

Next, the interlayer insulation film 48 is etched, using the hard mask 50 as a mask and the etching stopper film 46 as a stopper. Thereby, a contact hole 52 extending to the conductor plug 32 is formed. The diameter of the contact hole 52 is, for example, 50 nm.

Next, using photolithography, the hard mask 50 is further subjected to patterning. Thereby, an opening 56 for forming a trench 54 is formed in the hard mask 50.

Next, by etching the interlayer insulation film 48 using the hard mask 50 as a mask, the trench 54 is formed in the interlayer insulation film 48. The width of the trench 54 is, for example, 50 nm to 3 μm.

Next, the cap film 46 exposed in the contact hole 52 is removed by etching.

Figure 2F:
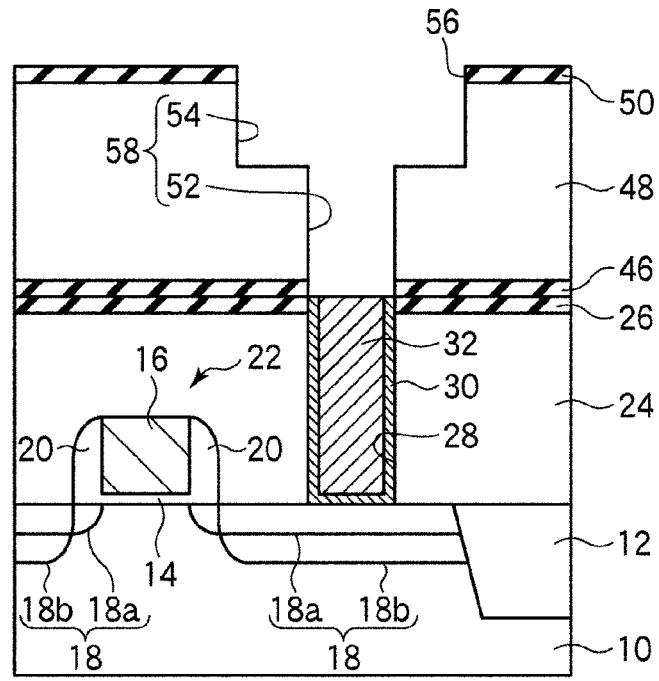

Thereby, an opening 58 including the contact hole 52 extending to the conductor plug 32 and the trench 54 connected to the upper portion of the contact hole 52 is formed in the interlayer insulation film 48 (refer to FIG. 2F).

Figure 2G:
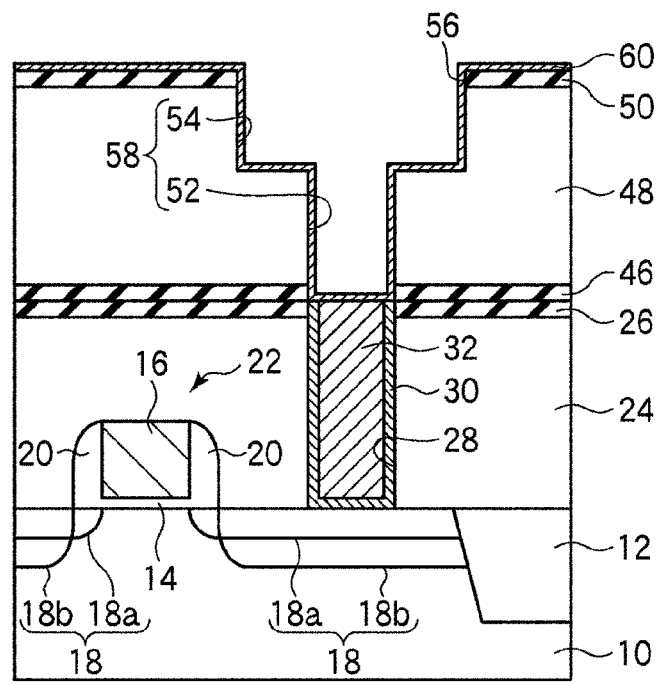

Next, as shown in FIG. 2G, a zirconium (Zr) film 60 is formed over the entire surface, for example, by magnetron sputtering. The thickness of the Zr film 60 is, for example, about 3 nm. The deposition conditions for the Zr film 60 are, for example, as follows. The target power is, for example, 10 to 20 kW. The Ar gas flow rate is 10 to 30 sccm. The substrate bias is, for example, 0 to 200 W.

Figure 2H:
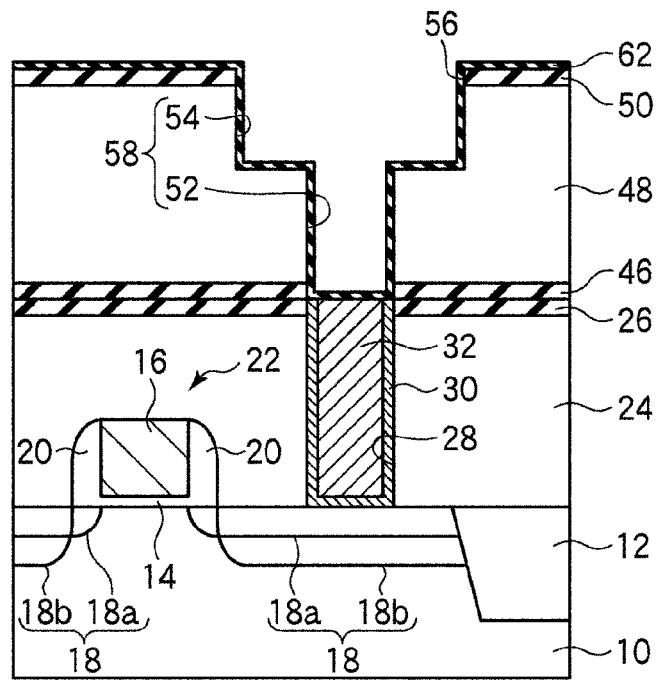

Next, by carrying out heat treatment in air, the Zr film 60 is oxidized. The heat treatment temperature is, for example, about 100° C. to 300° C. The heat treatment time is, for example, about 30 minutes. Thereby, the Zr film 60 is oxidized to form a zirconium oxide film 62 (refer to FIG. 2H).

Although the example in which the Zr film 60 is oxidized by carrying out heat treatment in air has been described above, heat treatment is not necessarily carried out in air. By carrying out heat treatment in an oxygen-containing atmosphere, the Zr film 60 can be oxidized.

Furthermore, although the example in which heat treatment is carried out when the Zr film 60 is oxidized has been described, heat treatment is not always necessary. Since Zr has high affinity toward oxygen, it is possible to oxidize the Zr film 60 without carrying out heat treatment.

Figure 2I:
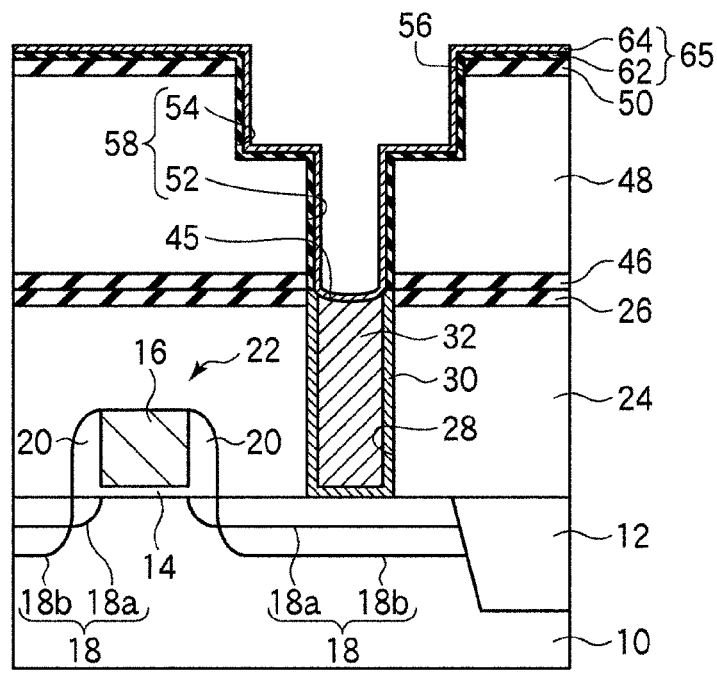

Next, as shown in FIG. 2I, a Zr film 64 is formed over the entire surface, for example, by magnetron sputtering. The thickness of the Zr film 64 is about 2 nm. In the process of forming the Zr film 64, film deposition is performed so that the Zr film 64 is formed over the entire surface, while selectively removing, by Zr ions, the zirconium oxide film 62 present at the bottom of the contact hole 52. The deposition conditions for the Zr film 64 are, for example, as follows. The target power is, for example, about 1 to 5 kW. The substrate bias is, for example, about 100 to 300 W. By depositing the Zr film 64 under such conditions, it is possible to form the Zr film 64 over the entire surface while selectively removing, by Zr ions, the zirconium oxide film 62 present at the bottom of the contact hole 52. Since the zirconium oxide film 62 at the bottom of the contact hole 52 is removed, good contact can be achieved. Since the bottom surface of the trench 54 is sufficiently large compared with the bottom surface of the contact hole 52, the zirconium oxide film 62 present at the bottom of the trench 54 is hardly etched by Zr ions in the process of forming the Zr film 64. Consequently, the zirconium oxide film 62 at the bottom surface of the trench 54 does not disappear. The Zr film 64 contributes to ensuring adhesion of the conductor plug 70a and the interconnect line 70b to the base. Furthermore, because of its good conductivity, the Zr film 64 contributes to a reduction in contact resistance between the conductor plug 70a and the conductor plug 32.

Thereby, a barrier film 65 including the zirconium oxide film 62 and the Zr film 64 is formed.

Figure 2J:
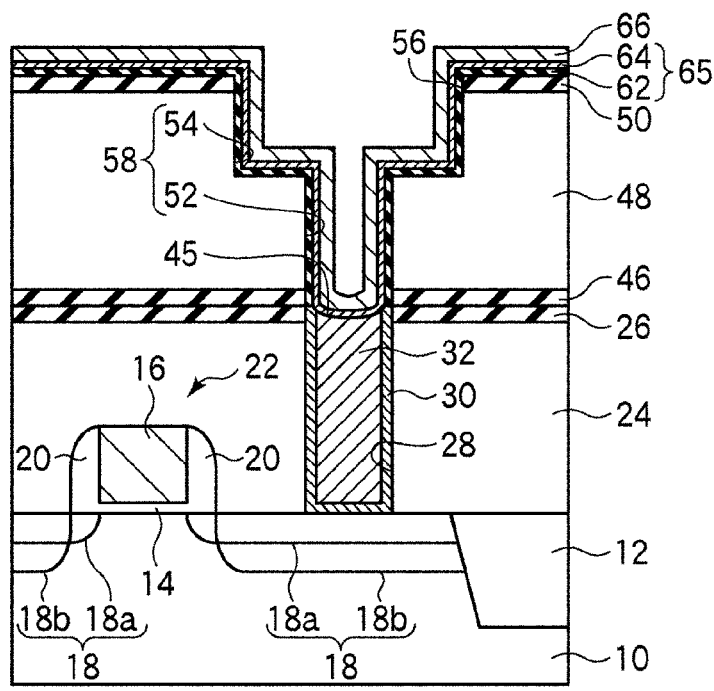

Next, as shown in FIG. 2J, a seed film 66 composed of Cu is formed over the entire surface, for example, by sputtering. The thickness of the seed film 66 is, for example, about 30 nm.

Figure 2K:
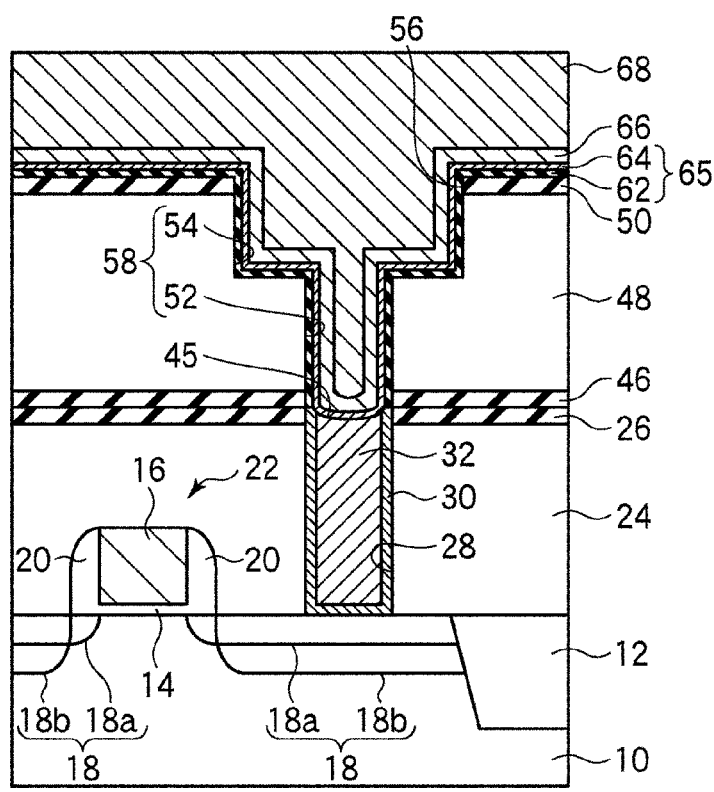

Next, as shown in FIG. 2K, a Cu film 68 is formed over the entire surface by electroplating, for example, using a copper sulfate plating bath. The thickness of the Cu film 68 is, for example, about 500 nm.

Next, heat treatment is carried out. The heat treatment temperature is, for example, about 150° C. to 350° C. The heat treatment time is, for example, about 60 to 3,600 seconds.

Next, the Cu film 68, the seed film 66, the Zr film 64, and the zirconium oxide film 62 are polished, for example, by CMP, until the surface of the cap film 50 is exposed.

Figure 2L:
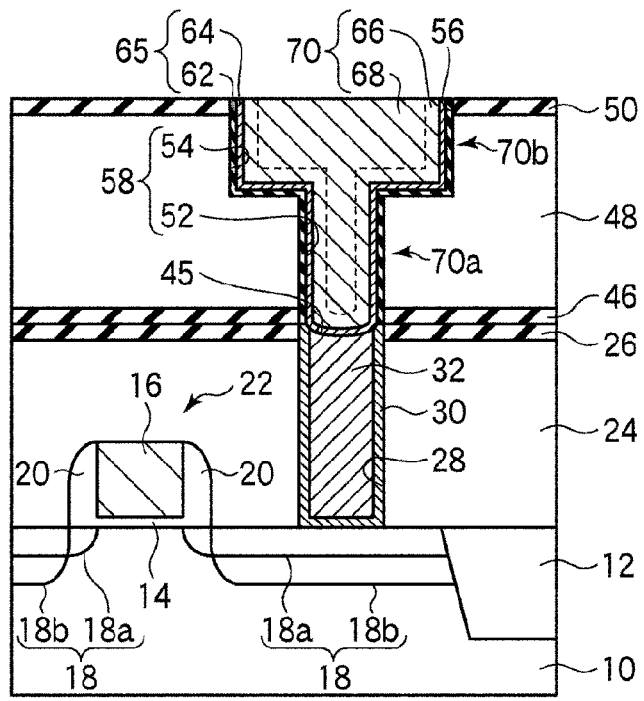

Thereby, a conductor plug 70a composed of Cu is embedded into the contact hole 52 and an interconnect line 70b composed of Cu is embedded into the trench 70b by the dual damascene process. That is, a conductor 70 having the conductor plug 70a and the interconnect line 70b integrally formed with the conductor plug 70a is embedded into the opening 58 (refer to FIG. 2L).

Next, a cap film 146, for example, composed of SiC is formed over the entire surface, for example, by CVD. The thickness of the cap film 146 is, for example, about 30 nm. The cap film 146 serves as an etching stopper during the etching of an interlayer insulation film 148.

Next, the interlayer insulation film 148, for example, composed of a porous low-dielectric-constant film is formed over the entire surface. The thickness of the interlayer insulation film 148 is, for example, 120 nm. As the interlayer insulation film 148, an organic low-dielectric-constant film may be used, or an inorganic low-dielectric-constant film may be used. As the material for the organic low-dielectric-constant film, for example, SiLK (registered trademark) can be used. As the inorganic low-dielectric-constant film, for example, a methylsilsesquioxane film or a SiOCH film can be used.

Figure 2M:
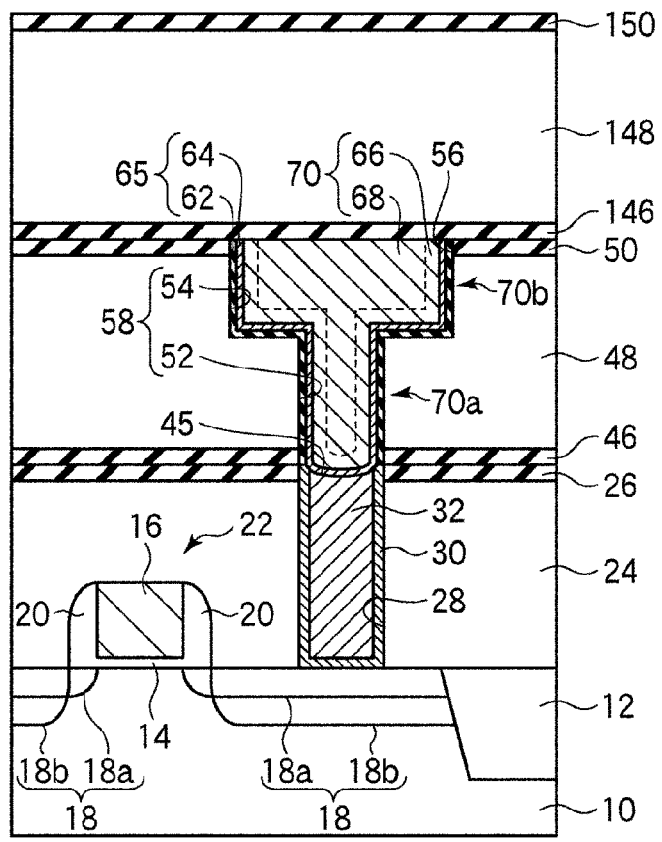

Next, a cap film 150, for example, composed of SiC is formed over the entire surface, for example, by CVD. The thickness of the cap film 150 is, for example, about 30 nm. The cap film 150 serves as a hard mask during the etching of the interlayer insulation film 148 (refer to FIG. 2M).

Next, using photolithography, the cap film 150 is subjected to patterning. Thereby, an opening (not shown) for forming a contact hole 152 is formed in the cap film 150. Thereby, a hard mask 150 composed of SiC is formed.

Next, the interlayer insulation film 148 is etched, using the hard mask 150 as a mask and the etching stopper film 146 as a stopper. Thereby, a contact hole 152 extending to the interconnect line 70b is formed. The diameter of the contact hole 152 is, for example, 50 nm.

Next, using photolithography, the hard mask 150 is further subjected to patterning. Thereby, an opening 156 for forming a trench 154 is formed in the hard mask 150.

Next, by etching the interlayer insulation film 148 using the hard mask 150 as a mask, the trench 154 is formed in the interlayer insulation film 148. The width of the trench 154 is, for example, about 50 nm to 3 μm.

Next, the cap film 146 exposed in the contact hole 152 is removed by etching.

Figure 2N:
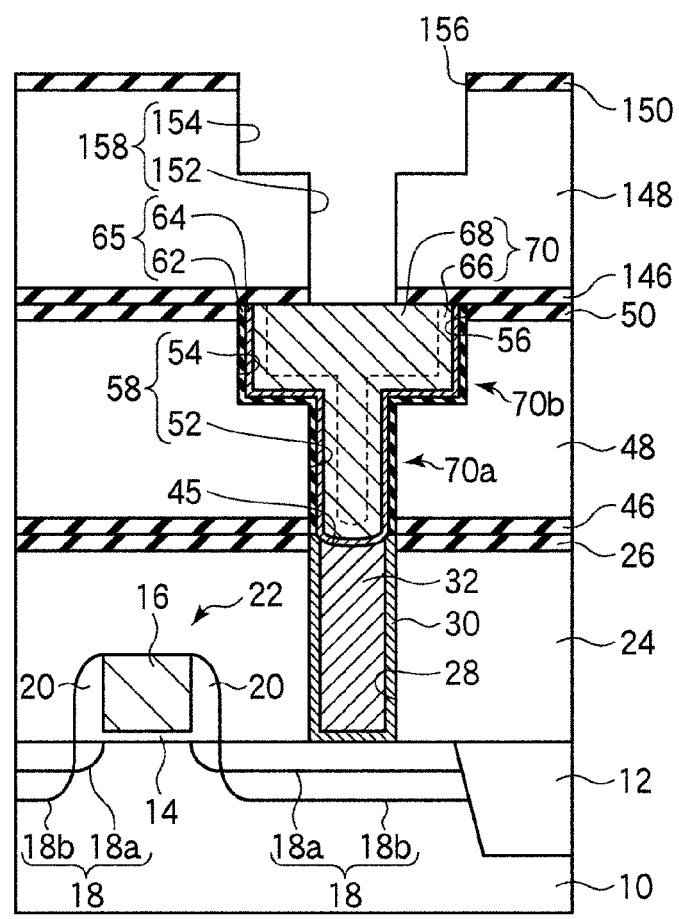

Thereby, an opening 158 including the contact hole 152 extending to the interconnect line 70b and the trench 154 connected to the upper portion of the contact hole 152 is formed in the interlayer insulation film 148 (refer to FIG. 2N).

Figure 2O:
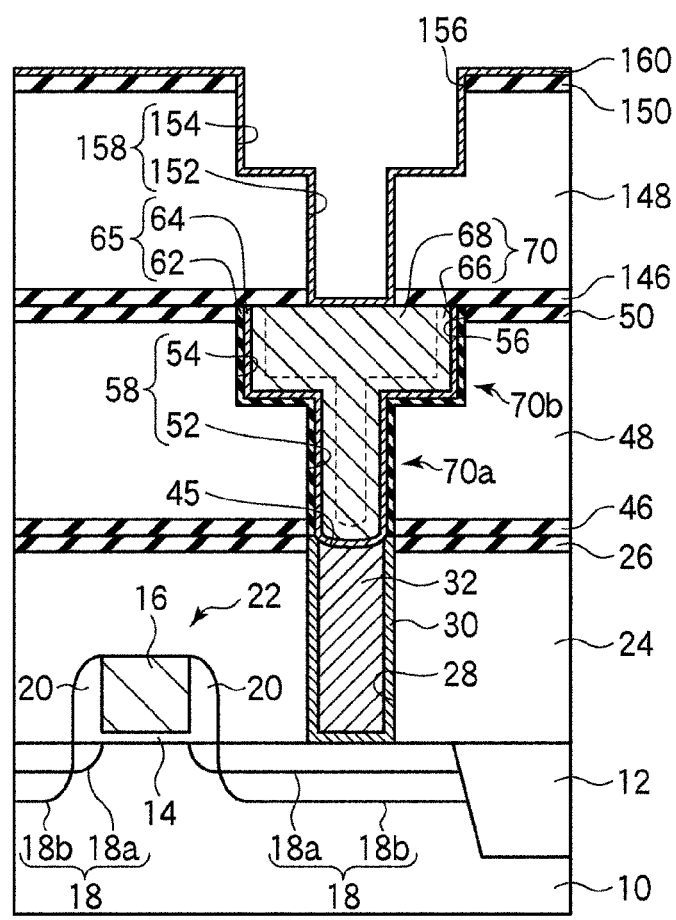

Next, as shown in FIG. 2O, a zirconium (Zr) film 160 is formed over the entire surface, for example, by magnetron sputtering. The thickness of the Zr film 160 is, for example, about 3 nm. The deposition conditions for the Zr film 160 are, for example, as follows. The target power is, for example, 10 to 20 kW. The Ar gas flow rate is 10 to 30 sccm. The substrate bias is, for example, 0 to 200 W.

Figure 2P:
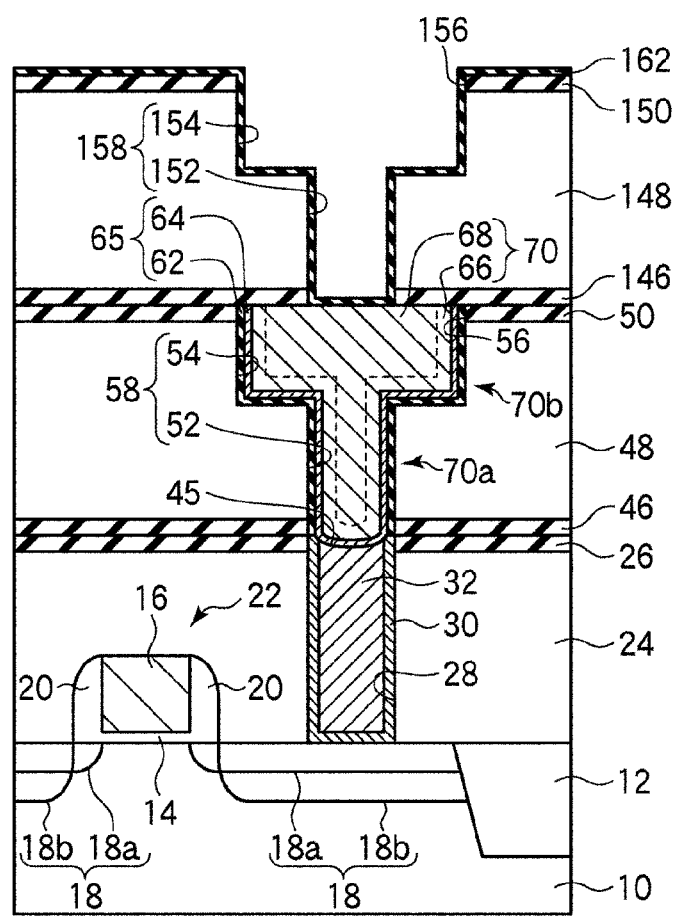

Next, by carrying out heat treatment in air, the Zr film 160 is oxidized. The heat treatment temperature is, for example, about 100° C. to 300° C. The heat treatment time is, for example, about 30 minutes. Thereby, the Zr film 160 is oxidized to form a zirconium oxide film 162 (refer to FIG. 2P).

Although the example in which the Zr film 160 is oxidized by carrying out heat treatment in air has been described above, heat treatment is not necessarily carried out in air. By carrying out heat treatment in an oxygen-containing atmosphere, the Zr film 160 can be oxidized.

Furthermore, although the example in which heat treatment is carried out when the Zr film 160 is oxidized has been described, heat treatment is not always necessary. Since Zr has high affinity toward oxygen, it is possible to oxidize the Zr film 160 without carrying out heat treatment.

Figure 2Q:
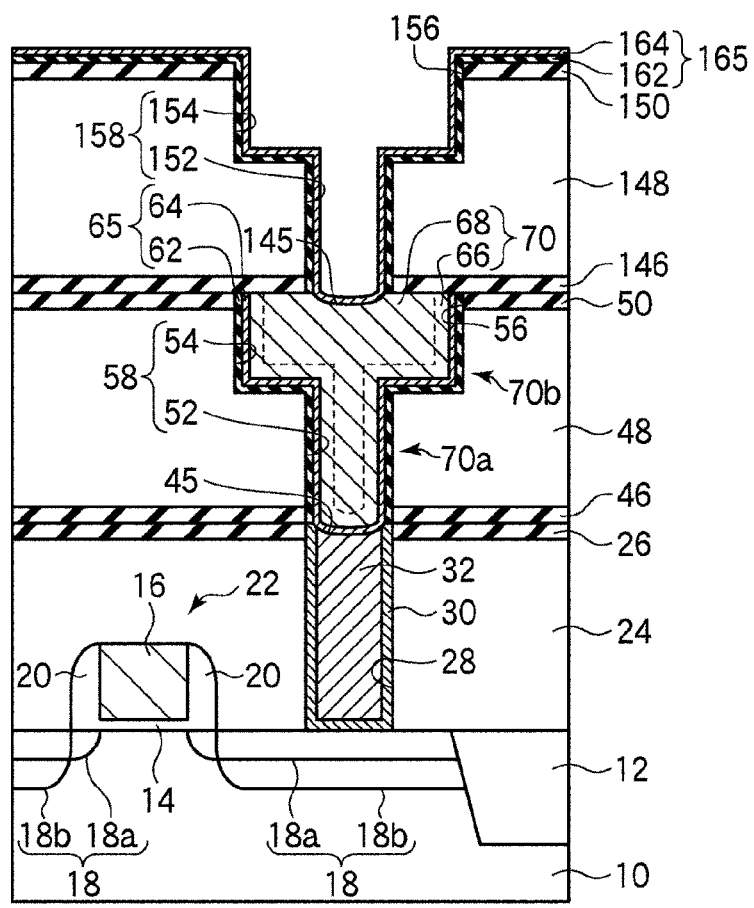

Next, as shown in FIG. 2Q, a Zr film 164 is formed over the entire surface, for example, by magnetron sputtering. The thickness of the Zr film 164 is about 2 nm. In the process of forming the Zr film 164, film deposition is performed so that the Zr film 164 is formed over the entire surface, while selectively removing, by Zr ions, the zirconium oxide film 162 present at the bottom of the contact hole 152. The deposition conditions for the Zr film 164 are, for example, as follows. The target power is, for example, about 1 to 5 kW. The substrate bias is, for example, about 100 to 300 W. By depositing the Zr film 164 under such conditions, it is possible to form the Zr film 164 over the entire surface while selectively removing, by Zr ions, the zirconium oxide film 162 present at the bottom of the contact hole 152. Since the zirconium oxide film 162 at the bottom of the contact hole 152 is removed, good contact can be achieved. Since the bottom surface of the trench 154 is sufficiently large compared with the bottom surface of the contact hole 152, the zirconium oxide film 162 present at the bottom of the trench 154 is hardly etched by Zr ions in the process of forming the Zr film 164. Consequently, the zirconium oxide film 162 at the bottom surface of the trench 154 does not disappear. The Zr film 164 contributes to ensuring adhesion of a conductor plug 170a and an interconnect line 170b to the base. Furthermore, because of its good conductivity, the Zr film 164 contributes to a reduction in contact resistance between the conductor plug 170a and the interconnect line 70b.

Thereby, a barrier film 165 including the zirconium oxide film 162 and the Zr film 164 is formed.

Figure 2R:
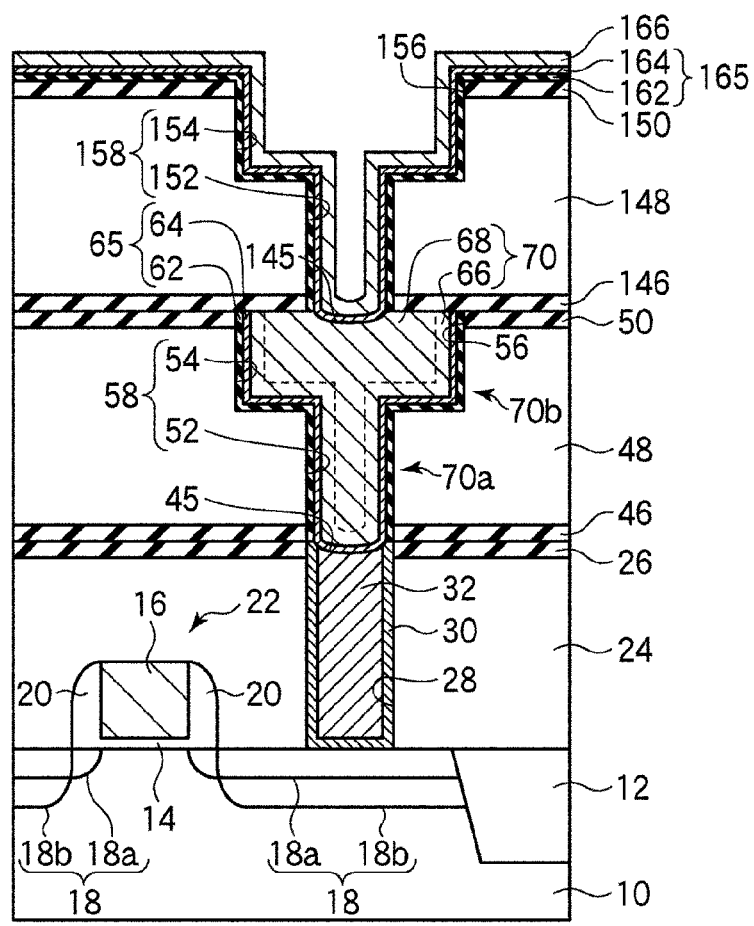

Next, as shown in FIG. 2R, a seed film 166 composed of Cu is formed over the entire surface, for example, by sputtering. The thickness of the seed film 166 is, for example, about 30 nm.

Figure 2S:
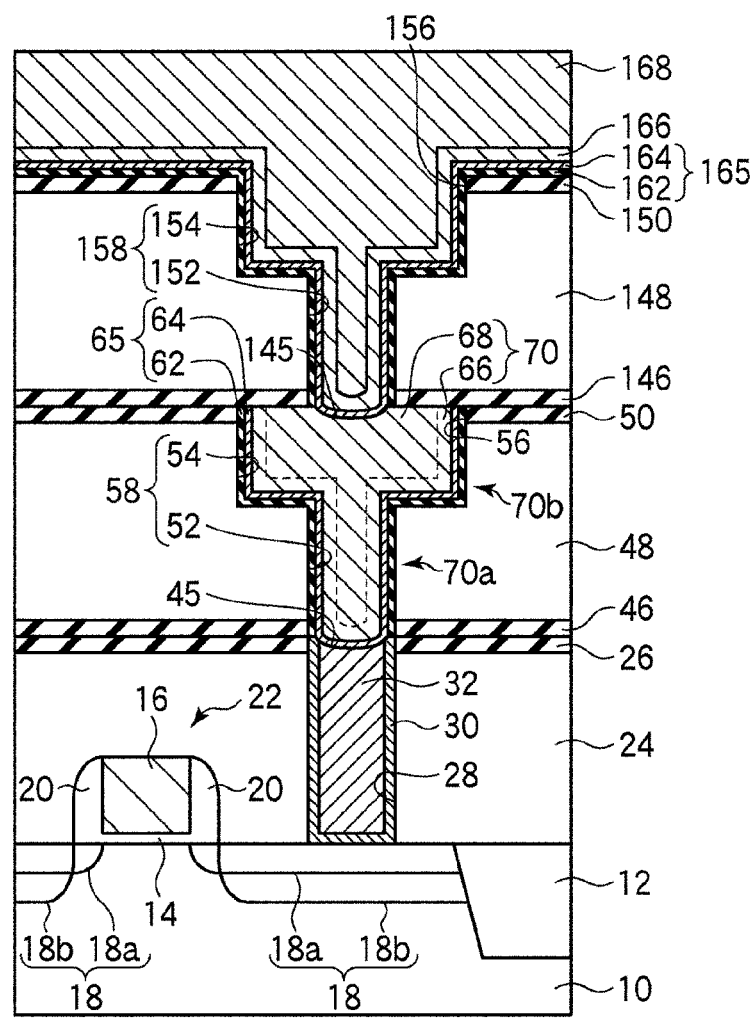
Figure 2T:
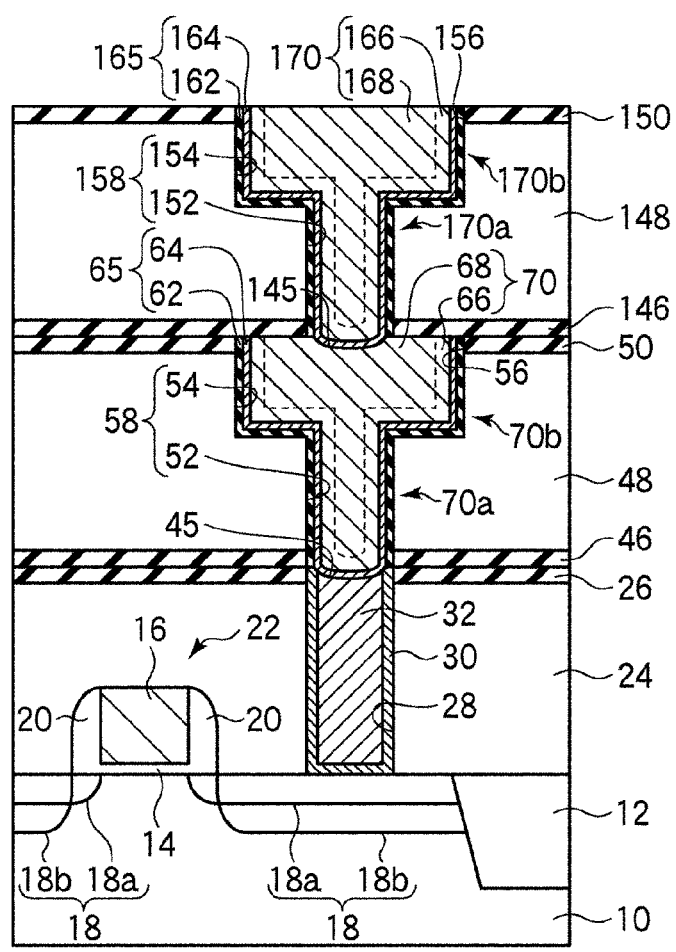

Next, as shown in FIG. 2S, a Cu film 168 is formed over the entire surface by electroplating, for example, using a copper sulfate plating bath. The thickness of the Cu film 168 is, for example, about 500 nm.

Next, heat treatment is carried out. The heat treatment temperature is, for example, 150° C. to 350° C. The heat treatment time is, for example, about 60 to 3,600 seconds.

Next, the Cu film 168, the seed film 166, the Zr film 164, and the zirconium oxide film 162 are polished, for example, by CMP, until the surface of the cap film 150 is exposed.

Thereby, the conductor plug 170a composed of Cu is embedded into the contact hole 152 and the interconnect line 170b composed of Cu is embedded into the trench 154 by the dual damascene process. That is, a conductor 170 having the conductor plug 170a and the interconnect line 170b integrally formed with the conductor plug 170a is embedded into the opening 158.

Then, an interconnect line (not shown) is further formed.

Thereby, a semiconductor device having a multilayer interconnection structure according to this embodiment is produced (refer to FIG. 2T).

(Evaluation Results)

The results of evaluation of the method for manufacturing a semiconductor device according to this embodiment will now be described.

Figure 3A:
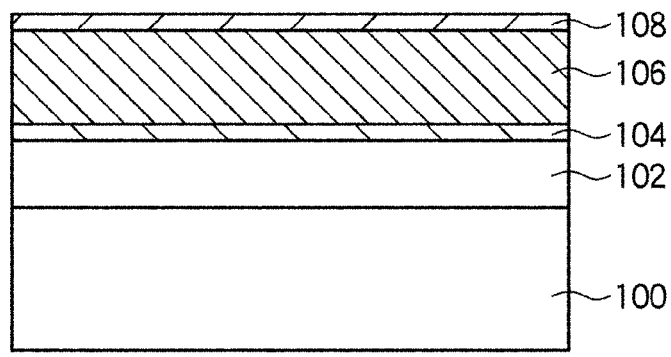
FIGS. 3A to 3L are cross-sectional views showing samples used for evaluation of barrier films.
Figure 3B:
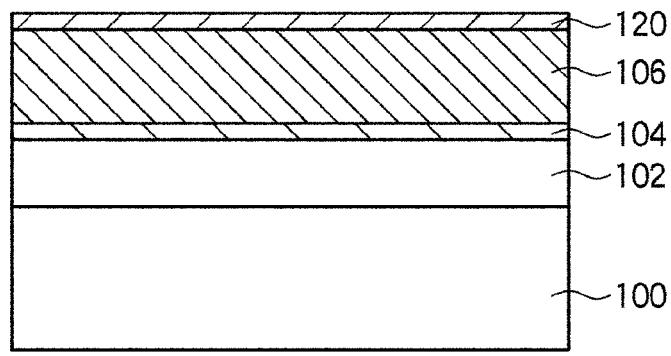
Figure 3C:
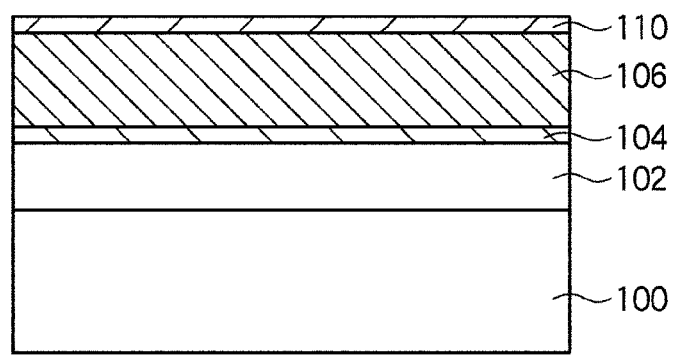
Figure 3D:
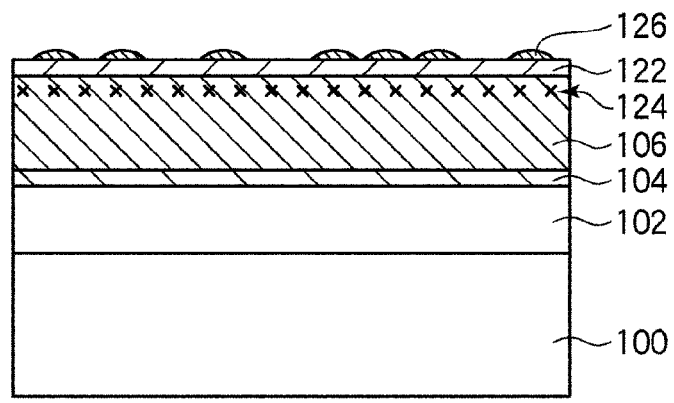
Figure 3E:
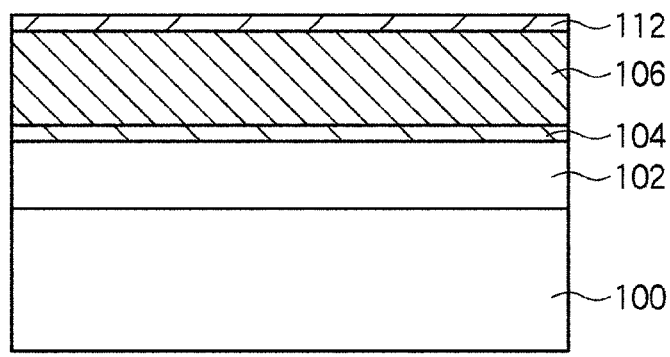
Figure 3F:
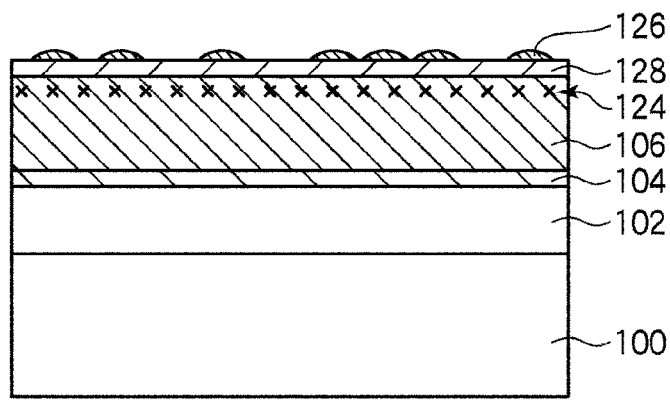
Figure 3G:
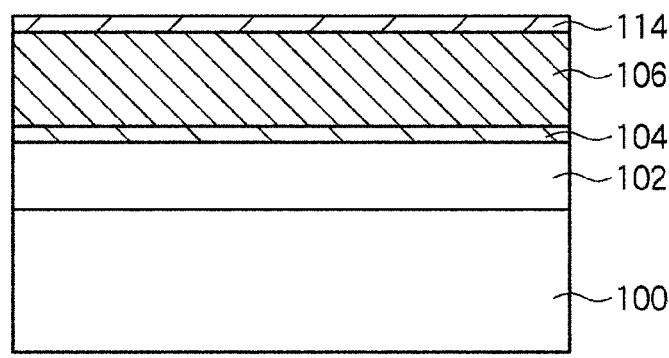
Figure 3H:
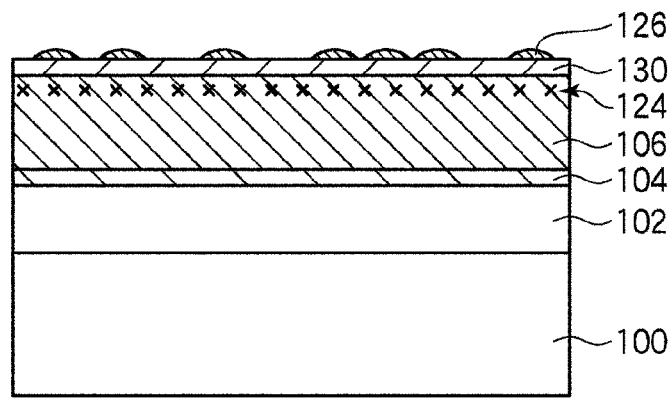
Figure 3I:
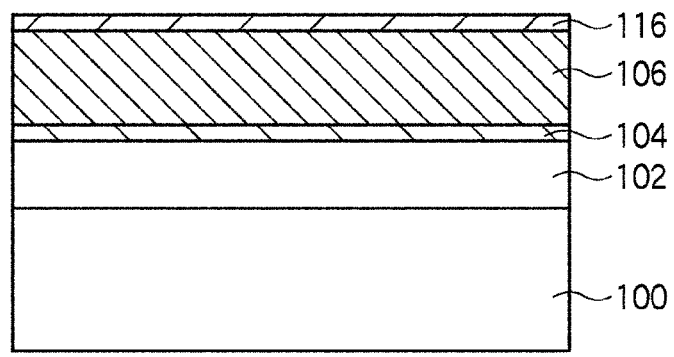
Figure 3J:
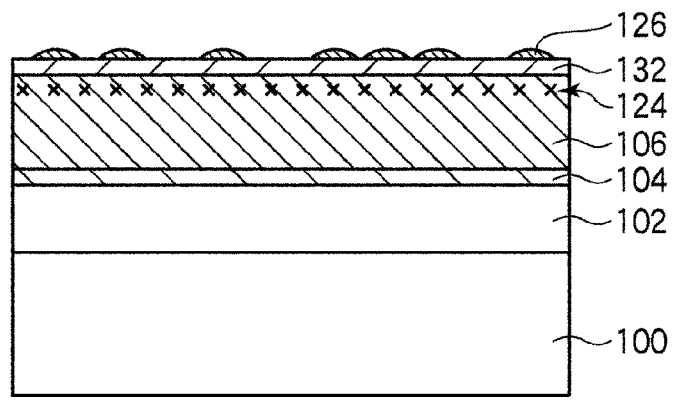
Figure 3K:
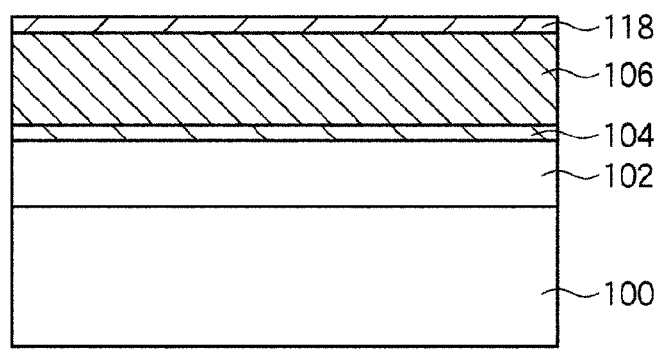
Figure 3L:
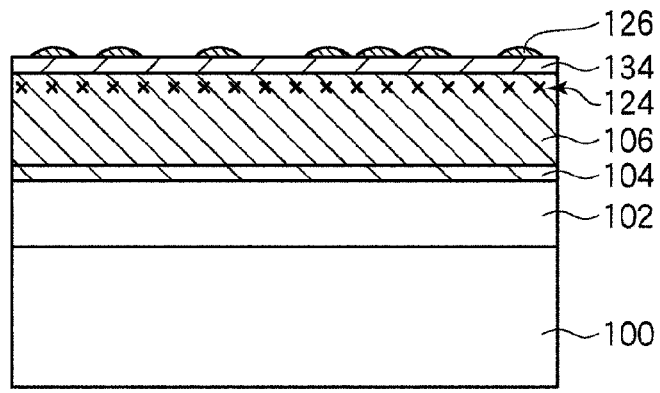

First, the results of evaluation of the barrier properties of barrier films will be described with reference to FIGS. 3A to 3L. FIGS. 3A to 3L are cross-sectional views showing samples used for evaluation of barrier films. FIGS. 3A and 3B are cross-sectional views showing the sample of Example 1. FIGS. 3C and 3D are cross-sectional views showing the sample of Comparative Example 1. FIGS. 3E and 3F are cross-sectional views showing the sample of Comparative Example 2. FIGS. 3G and 3H are cross-sectional views showing the sample of Comparative Example 3. FIGS. 3I and 3J are cross-sectional views showing the sample of Comparative Example 4. FIGS. 3K and 3L are cross-sectional views showing the sample of Comparative Example 5. FIGS. 3A, 3C, 3E, 3G, 3I, and 3K each show a state before heat treatment. FIGS. 3B, 3D, 3F, 3H, 3J, and 3L each show a state after heat treatment.

When a sample of Example 1 was produced, as shown in FIG. 3A, a silicon oxide film 102 with a thickness of 100 nm was formed by thermal oxidation over the entire surface of a silicon substrate 100. Next, an underlying film 104 composed of a tantalum film with a thickness of 10 nm was formed by sputtering over the entire surface. Such an underlying film 104 was provided to ensure adhesion of a Cu film 106 to the base. Then, the Cu film 106 with a thickness of 60 nm was formed by sputtering on the underlying film 104. Next, a barrier film 108 with a thickness of 5 nm was formed by sputtering on the Cu film 106. Thereby, the sample of Example 1 was obtained.

When a sample of Comparative Example 1 was produced, as shown in FIG. 3C, a barrier film 110 composed of a ZrN film was formed on a Cu film 106. When the ZrN film 110 was formed, Ar gas and $N_2$ gas were introduced into a film deposition chamber. In Comparative Example 1-1, when the ZrN film 110 was formed, the flow ratio of $N_2$ gas to be introduced into the film deposition chamber was set at 0.01.

In Comparative Example 1-2, when the ZrN film 110 was formed, the flow ratio of $N_2$ gas to be introduced into the film deposition chamber was set at 0.03. In Comparative Example 1-3, when the ZrN film 110 was formed, the flow ratio of $N_2$ gas to be introduced into the film deposition chamber was set at 0.05. In Comparative Example 1-4, when the ZrN film 110 was formed, the flow ratio of $N_2$ gas to be introduced into the film deposition chamber was set at 0.1. In Comparative Example 1-5, when the ZrN film 110 was formed, the flow ratio of $N_2$ gas to be introduced into the film deposition chamber was set at 0.2. In Comparative Example 1-6, when the ZrN film 110 was formed, the flow ratio of $N_2$ gas to be introduced into the film deposition chamber was set at 0.3. In Comparative Example 1-7, when the ZrN film 110 was formed, the flow ratio of $N_2$ gas to be introduced into the film deposition chamber was set at 0.4. In Comparative Example 1-8, when the ZrN film 110 was formed, the flow ratio of $N_2$ gas to be introduced into the film deposition chamber was set at 0.5. In Comparative Example 1-9, when the ZrN film 110 was formed, the flow ratio of $N_2$ gas to be introduced into the film deposition chamber was set at 0.7.

When a sample of Comparative Example 2 was produced, as shown in FIG. 3E, a barrier film 112 composed of a Ta film was formed on a Cu film 106.

When a sample of Comparative Example 3 was produced, as shown in FIG. 3G, a barrier film 114 composed of a TaN film was formed on a Cu film 106.

When a sample of Comparative Example 4 was produced, as shown in FIG. 3I, a barrier film 116 composed of a Ti film was formed on a Cu film 106.

When a sample of Comparative Example 5 was produced, as shown in FIG. 3K, a barrier film 118 composed of a TiN film was formed on a Cu film 106.

Each of the samples was subjected to heat treatment in air at 400° C. for 30 minutes. The conditions (400° C. and 30 minutes) are considered harsh for evaluation of the barrier properties.

After the heat treatment was performed, the samples were visually examined, and the results described below were obtained.

With respect to the sample of Example 1, the surface of the substrate was not discolored.

On the other hand, with respect to each of the samples of Comparative Examples 1-1 to 1-9, the sample of Comparative Example 2, the sample of Comparative Example 3, the sample of Comparative Example 4, and the sample of Comparative Example 5, the surface of the substrate was discolored.

Furthermore, the samples produced as described above were analyzed using an X-ray photoelectron spectroscopy (XPS) apparatus, and the results described below were obtained.

First, with respect to the sample of Example 1, the surface of the Zr film 108 before heat treatment was analyzed. As a result, the peak corresponding to photoelectrons emitted from the Zr 3d orbital, the peak corresponding to photoelectrons emitted from the O 1s orbital, and the peak corresponding to photoelectrons emitted from the C 1s orbital were observed. The percentage of the peak corresponding to photoelectrons emitted from the Zr 3d orbital was 24%, the percentage of the peak corresponding to photoelectrons emitted from the O 1s orbital was 56%, and the percentage of the peak corresponding to photoelectrons emitted from the C 1s orbital was 20%.

On the other hand, no peak corresponding to photoelectrons emitted from the Cu 2p3 orbital was observed.

Next, the surface of the $ZrO_2$ film 120 having undergone heat treatment in air at 300° C. was analyzed. As a result, the peak corresponding to photoelectrons emitted from the Zr 3d orbital, the peak corresponding to photoelectrons emitted from the O 1s orbital, and the peak corresponding to photoelectrons emitted from the C 1s orbital were observed. The percentage of the peak corresponding to photoelectrons emitted from the Zr 3d orbital was 24%, the percentage of the peak corresponding to photoelectrons emitted from the O 1s orbital was 56%, and the percentage of the peak corresponding to photoelectrons emitted from the C 1s orbital was 29%.

On the other hand, no peak corresponding to photoelectrons emitted from the Cu 2p3 orbital was observed.

In the sample of Example 1, the Cu film 106 was not oxidized. Furthermore, in the sample of Example 1, Cu did not diffuse onto the zirconium oxide film 120.

As is evident from the results, in the sample of Example 1, the surface of the Zr film 108 is oxidized to form the zirconium oxide film 120 (refer to FIG. 3B), and the zirconium oxide film 120 can reliably prevent the diffusion of oxygen, moisture, and Cu.

In the samples of Comparative Examples 1-1 to 1-9, the ZrN film 110 was oxidized to form a ZrON film 122 (refer to FIG. 3D). Furthermore, a Cu oxide 124 was formed in the upper portion of the Cu film 106, and also a Cu oxide 126 was formed on the surface of the ZrON film 122. As is evident from the results, the ZrN film 110 and the ZrON film 122 cannot prevent the diffusion of oxygen, moisture, and Cu sufficiently. Moreover, even when the flow ratio of $N_2$ gas to be introduced into the film deposition chamber was only 0.01 in the process of forming the ZrN film 110, the Cu oxide 124 was formed on the upper portion of the Cu film 106. Furthermore, the Cu oxide 126 was also formed on the surface of the ZrON film 122. As is evident from the results, even if a small amount of nitrogen is incorporated into the Zr film, good barrier properties cannot be obtained.

In the sample of Comparative Example 2, the Ta film 112 was oxidized to form a tantalum oxide film 128 (refer to FIG. 3F). Furthermore, a Cu oxide 124 was observed in the upper portion of the Cu film 106, and also a Cu oxide 126 was observed on the surface of the tantalum oxide film 128. As is evident from the results, the Ta film 112 and the tantalum oxide film 128 cannot prevent the diffusion of oxygen, moisture, and Cu sufficiently.

In the sample of Comparative Example 3, the TaN film 114 was oxidized to form a TaON film 130 (refer to FIG. 3H). Furthermore, a Cu oxide 124 was formed in the upper portion of the Cu film 106, and also a Cu oxide 126 was formed on the surface of the TaON film 130. As is evident from the results, the TaN film 114 and the TaON film 130 cannot prevent the diffusion of oxygen, moisture, and Cu sufficiently.

In the sample of Comparative Example 4, the Ti film 116 was oxidized to form a titanium oxide film 132 (refer to FIG. 3J). Furthermore, a Cu oxide 124 was formed in the upper portion of the Cu film 106, and also a Cu oxide 126 was formed on the surface of the titanium oxide film 132. As is evident from the results, the Ti film 116 and the titanium oxide film 132 cannot prevent the diffusion of oxygen, moisture, and Cu sufficiently.

In the sample of Comparative Example 5, the TiN film 118 was oxidized to form a TiON film 134 (refer to FIG. 3L). Furthermore, a Cu oxide 124 was formed in the upper portion of the Cu film 106, and also a Cu oxide 126 was formed on the surface of the TiON film 134. As is evident from the results, the TiN film 118 and the TiON film 134 cannot prevent the diffusion of oxygen, moisture, and Cu sufficiently.

According to this embodiment, the barrier film 65 is composed of a laminate including the zirconium oxide film 62 and the Zr film 64, and the barrier film 165 is composed of a laminate including the zirconium oxide film 162 and the Zr film 164. The zirconium oxide films 62 and 162, even with a very small thickness, can reliably prevent the diffusion of Cu, oxygen, moisture, etc. Furthermore, the Zr films 64 and 164 contribute to ensuring adhesion of the conductor plug 70a or 170a and the interconnect line 70b or 170b to the base. Furthermore, because of its good conductivity, the Zr film 64 contributes to a decrease in contact resistance between the conductor plug 70a and the conductor plug 32. Furthermore, because of its good conductivity, the Zr film 164 contributes to a decrease in contact resistance between the conductor plug 170a and the interconnect line 70b. Consequently, according to this embodiment, high-quality barrier films 65 and 165 can be formed at a small thickness without degrading reliability or manufacturing yield, and furthermore, miniaturization of the conductor plugs 70a and 170a and the interconnect lines 70b and 170b can be realized.

Moreover, the zirconium oxide films 62 and 162 are not easily degraded by moisture, oxygen, etc. Therefore, even if large amounts of moisture, oxygen, etc. are released from the interlayer insulation film 48 or 148, the barrier properties of the zirconium oxide film 62 or 162 are not degraded. Consequently, according to this embodiment, a porous low-dielectric-constant insulation film containing relatively large amounts of oxygen, moisture, etc. can be used as each of the interlayer insulation film 48 and 148.

Modified Example

A modified example of a method for manufacturing a semiconductor device according to this embodiment will now be described with reference to FIGS. 4A to 4H. FIGS. 4A to 4H are cross-sectional views showing the steps in a method for manufacturing a semiconductor device according to the modified example.

The method for manufacturing the semiconductor device according to the modified example is mainly characterized in that a zirconium oxide film 62 is directly formed on an interlayer insulation film 48 provided with an opening 58, and a zirconium oxide film 162 is directly formed on an interlayer insulation film 148 provided with an opening 158.

Figure 4A:
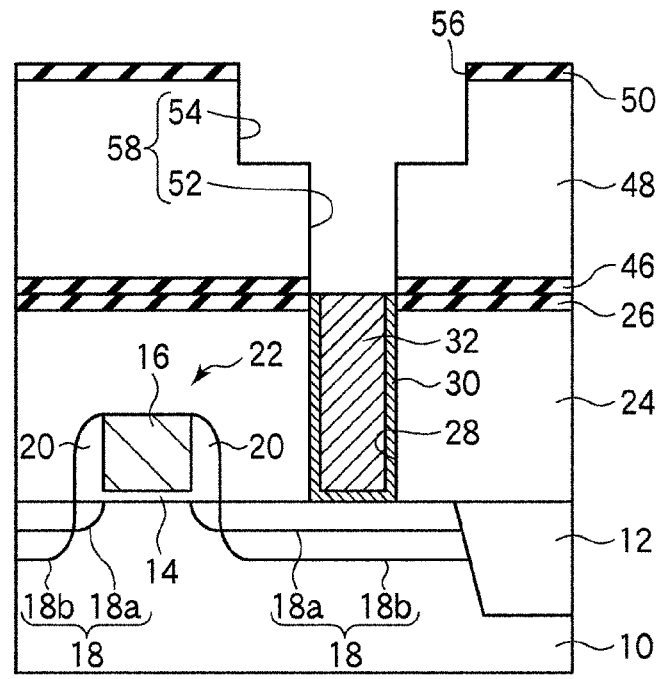
FIGS. 4A to 4H are cross-sectional views showing the steps in a method for manufacturing a semiconductor device according to a modified example of the first embodiment.

The method according to the modified example is the same, up to the step of forming the opening 58 in the interlayer insulation film 48, as the method for manufacturing the semiconductor device according to the first embodiment described above with reference to FIGS. 2A to 2F, and thus descriptions thereof are omitted (refer to FIG. 4A).

Figure 4B:
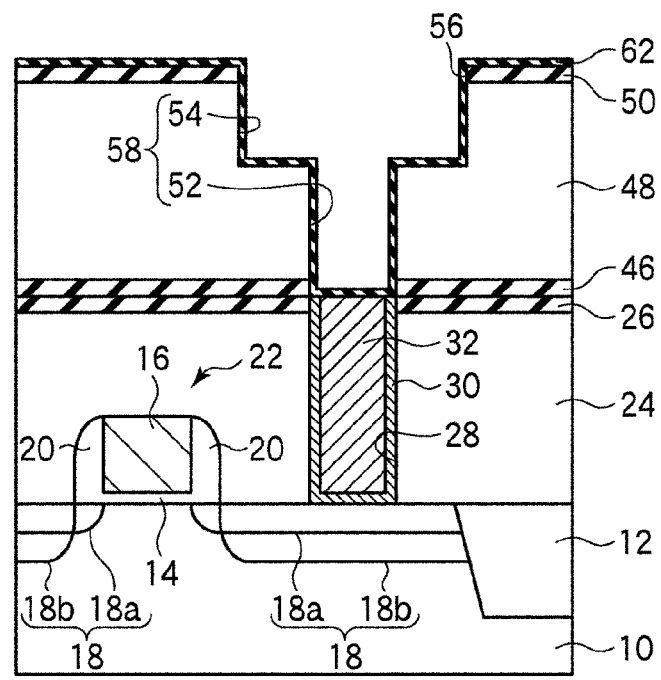
Figure 4C:
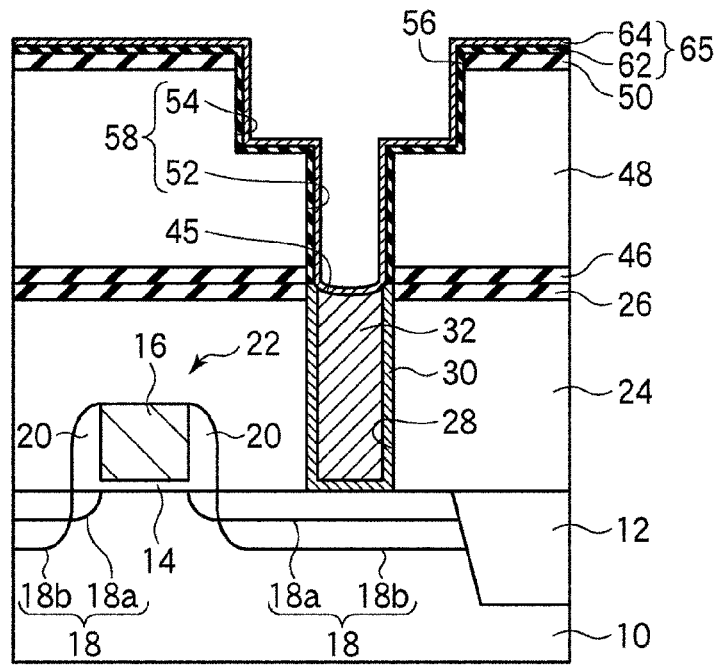

Next, as shown in FIG. 4B, the zirconium oxide film 62 is formed by sputtering in an oxygen-containing atmosphere. The conditions for forming the zirconium oxide film 62 are, for example, as follows. As the gas to be introduced into a film deposition chamber, for example, Ar gas and oxygen gas are used. The Ar gas flow rate is, for example, 10 to 30 sccm. The oxygen gas flow rate is, for example, 10 sccm. Since Zr has high affinity toward oxygen, it is possible to form the zirconium oxide film 62 even when the flow ratio of the oxygen gas to be introduced into the film deposition chamber is relatively low. The target power is, for example, 5 to 10 kW. The substrate bias is, for example, 0 to 100 W.

Next, as in the method for manufacturing the semiconductor device described above with reference to FIG. 2I, a Zr film 64 is formed over the entire surface while removing, by Zr ions, the zirconium oxide film 62 at the bottom of the contact hole 52.

Figure 4D:
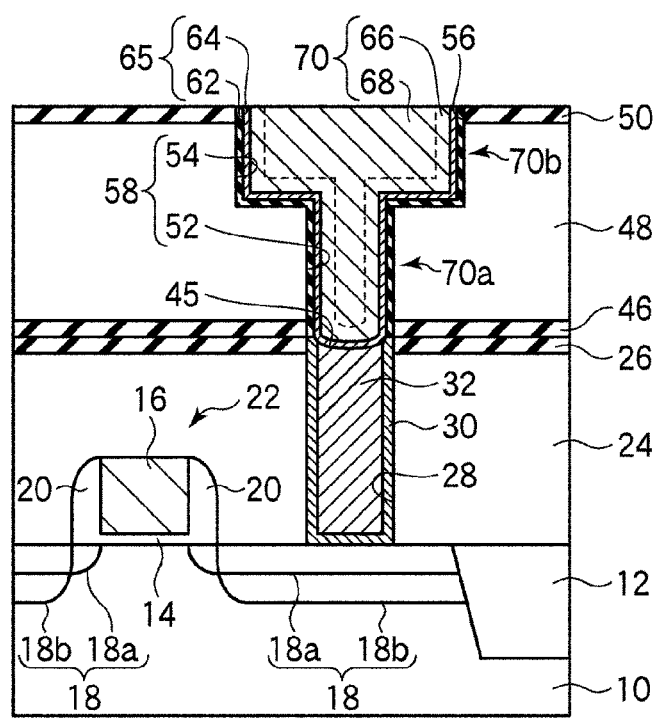

Thereby, a barrier film 65 including the zirconium oxide film 62 and the Zr film 64 is formed (refer to FIG. 4D).

Next, the step of forming a seed film 66 to the step of embedding a conductor 70 into the opening 58 are carried out in the same manner as in the method for manufacturing the semiconductor device according to the first embodiment described above with reference to FIGS. 2J to 2L, and thus descriptions thereof are omitted (refer to FIG. 4D).

Figure 4E:
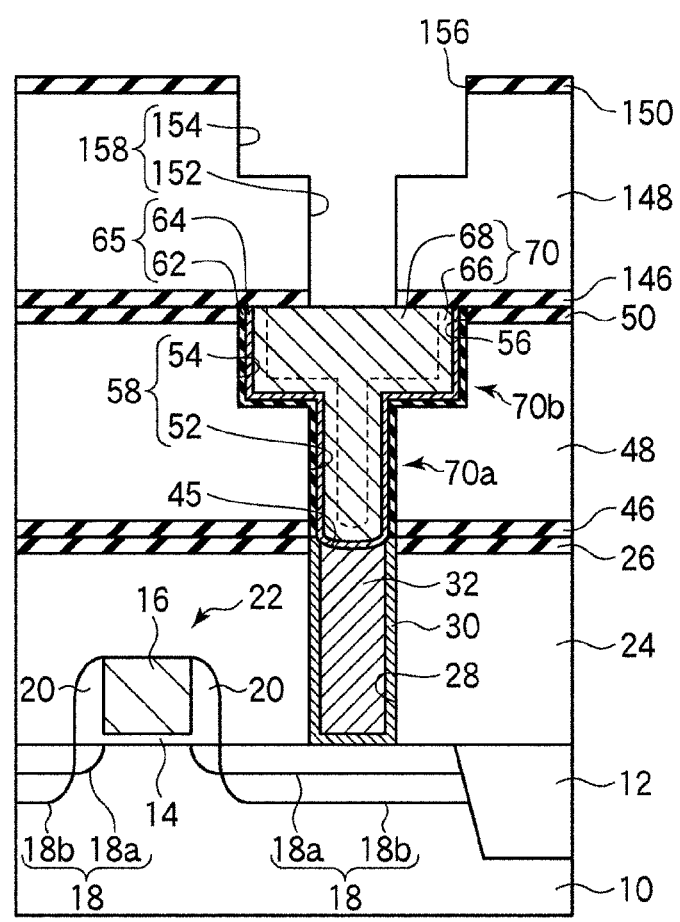

Next, the step of forming a cap film 146 to the step of forming an opening 158 are carried out in the same manner as in the method for manufacturing the semiconductor device according to the first embodiment described above with reference to FIGS. 2M and 2N, and thus descriptions thereof are omitted (refer to FIG. 4E).

Figure 4F:
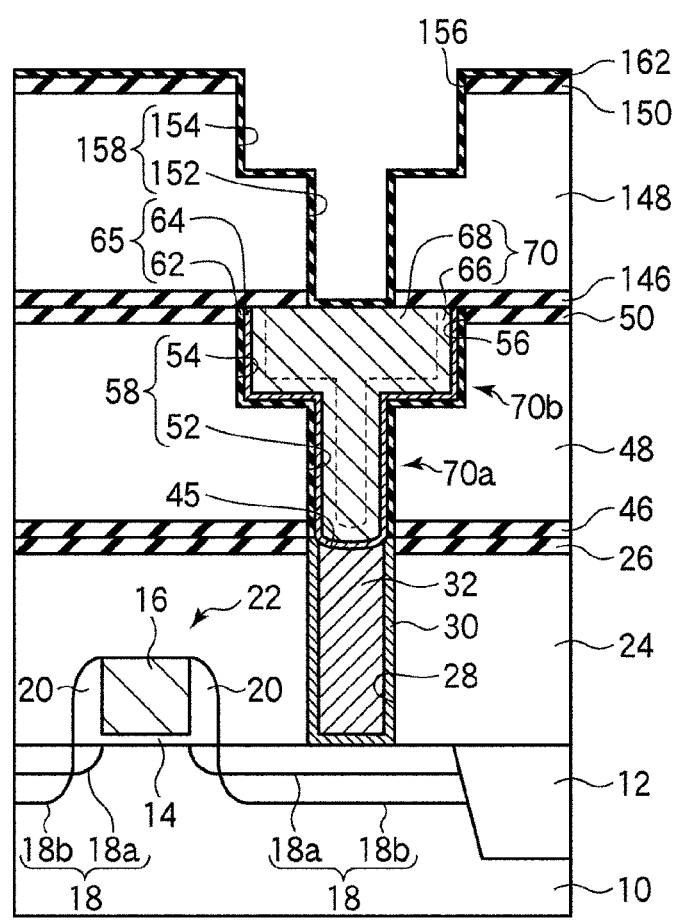

Next, the zirconium oxide film 162 is formed by sputtering in an oxygen-containing atmosphere as in the method described above with reference to FIG. 4B (refer to FIG. 4F).

Next, a Zr film 164 is formed over the entire surface while removing, by Zr ions, the zirconium oxide film 162 at the bottom of the contact hole 152 as in the method described above with reference to FIG. 4C.

Figure 4G:
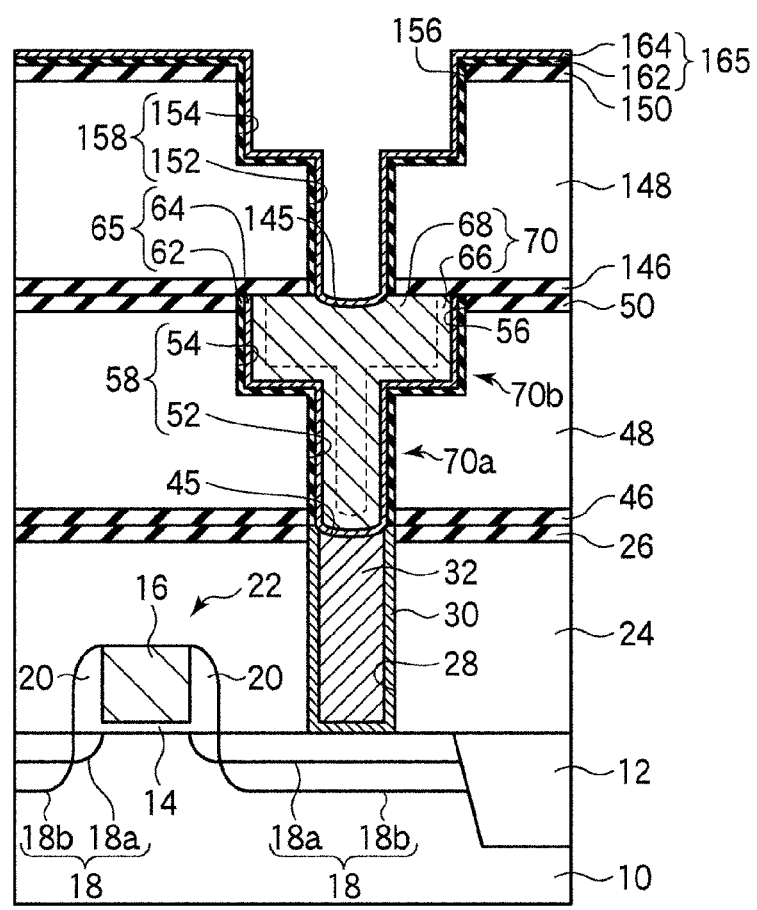

Thereby, a barrier film 165 including the zirconium oxide film 162 and the Zr film 164 is formed (refer to FIG. 4G).

The subsequent steps of the method for manufacturing the semiconductor device are carried out as in the method for manufacturing the semiconductor device according to the first embodiment described above with reference to FIGS. 2R to 2T, and thus descriptions thereof are omitted.

Figure 4H:
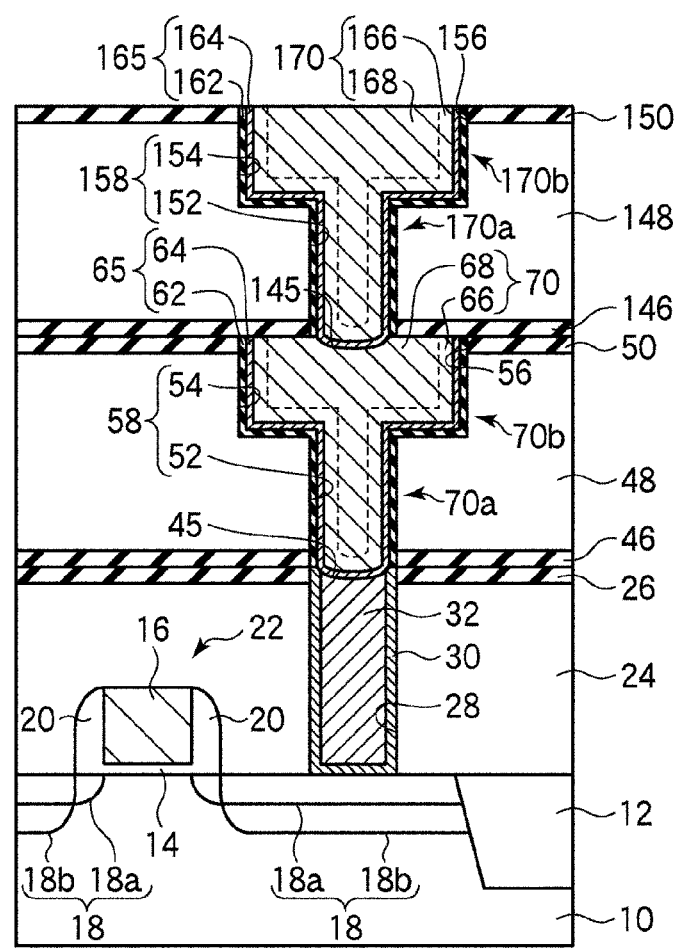

Thereby, a semiconductor device according to the modified example is produced (refer to FIG. 4H). As described above, the zirconium oxide film 62 may be directly formed on the interlayer insulation film 48 provided with the opening 58, and the zirconium oxide film 162 may be directly formed on the interlayer insulation film 148 provided with the opening 158.

Second Embodiment

A method for manufacturing a semiconductor device according to a second embodiment of the present invention will now be described with reference to FIGS. 5A to 5L. FIGS. 5A to 5L are cross-sectional views showing the steps in the method for manufacturing a semiconductor device according to this embodiment. The same reference numerals are used for the same constitutional elements as those for the semiconductor device and the method for manufacturing the same according to the first embodiment shown in FIGS. 1 to 4H, and descriptions thereof are omitted or simplified.

The method for manufacturing the semiconductor device according to this embodiment is mainly characterized in that after each of the zirconium oxide films 62 and 162 is formed, each of the zirconium oxide films 62 and 162 respectively disposed at the bottom of the contact holes 52 and 152 is selectively removed by etching, and then each of the Zr films 64 and 164 is formed.

First, the step of forming an element isolation region 12 in a semiconductor substrata 10 to the step of forming an opening 58 are carried out as in the method for manufacturing the semiconductor device according to the first embodiment described above with reference to FIGS. 2A to 2F, and thus descriptions thereof are omitted (refer to 5A).

Figure 5A:
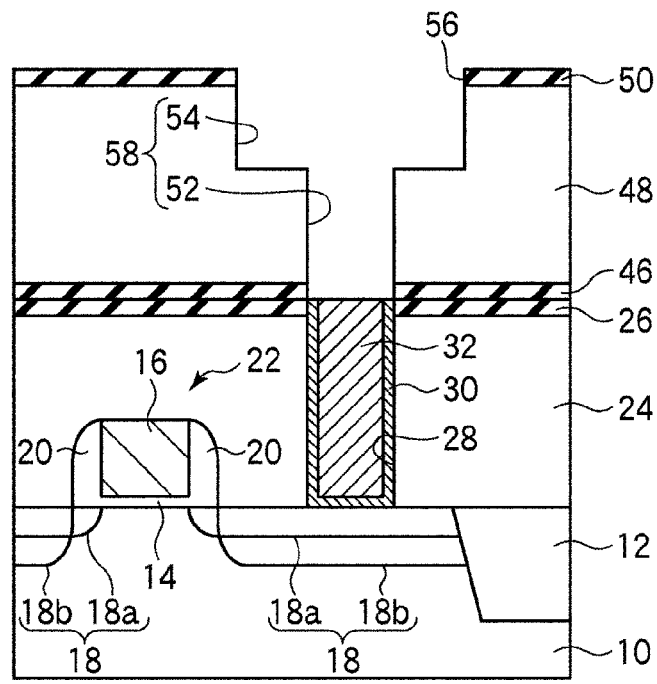
FIGS. 5A to 5L are cross-sectional views showing the steps in a method for manufacturing a semiconductor device according to a second embodiment.
Figure 5B:
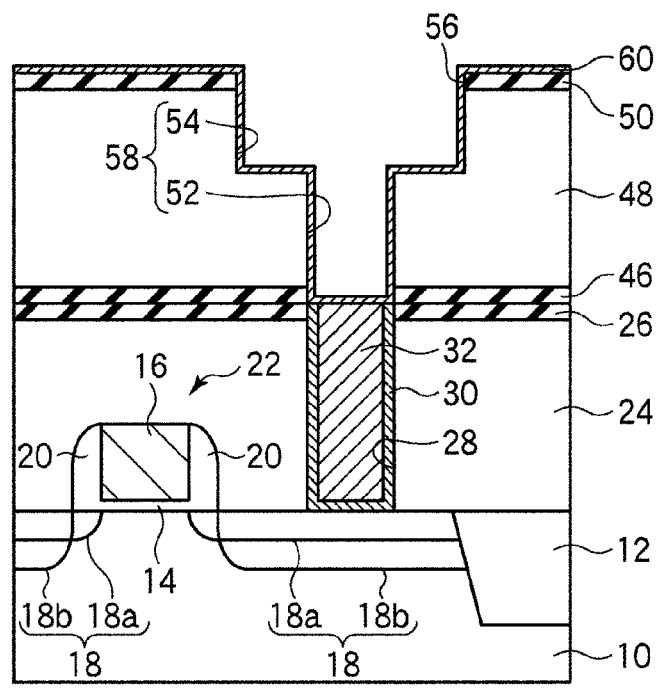
Figure 5C:
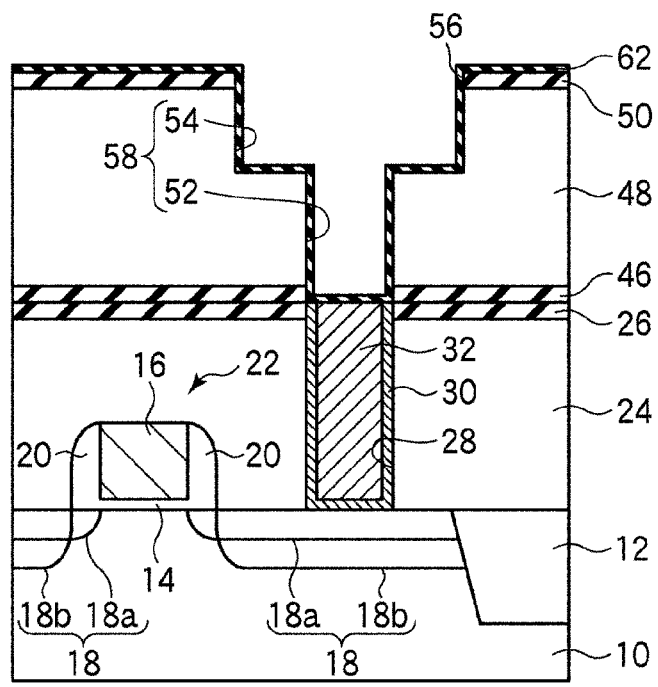

Next, a zirconium (Zr) film 60 is formed over the entire surface as in the method for manufacturing the semiconductor device described above with reference to FIG. 2G (refer to FIG. 5B).

Next, the Zr film 60 is oxidized as in the method for manufacturing the semiconductor device described above with reference to FIG. 2H. Thereby, the Zr film 60 is oxidized to form the zirconium oxide film 62 (refer to FIG. 5C).

Figure 5D:
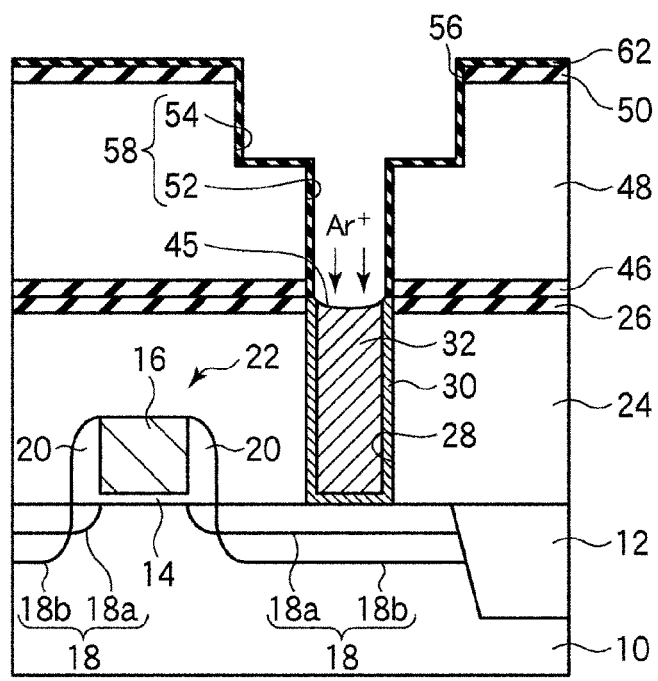

Next, as shown in FIG. 5D, for example, using Ar ions, the zirconium oxide film 62 at the bottom of the contact hole 52 is selectively removed by etching. When the zirconium oxide film 62 at the bottom of the contact hole 52 is selectively removed by etching, a sputtering apparatus used for forming a seed film 66, which will be described below, can be used. The target power is set, for example, at about 0 to 500 W. The substrate bias is set, for example, at 200 to 400 W. By using such conditions, Ar ions are concentrated at the bottom of the contact hole 52, and thus the zirconium oxide film 62 at the bottom of the contact hole 62 can be selectively removed. Since the zirconium oxide film 62 at the bottom of the contact hole 52 is removed, good contact can be achieved.

Since the bottom surface of the trench 54 is sufficiently large compared with the bottom surface of the contact hole 52, Ar ions are not concentrated at the bottom of the trench 54. Therefore, the zirconium oxide film 62 present at the bottom surface of the trench 54 is hardly etched by Ar ions. Consequently, the zirconium oxide film 62 at the bottom surface of the trench 54 does not disappear.

The zirconium oxide film 62 at the bottom of the contact hole 52 may be selectively removed by etching using a different sputtering apparatus from the sputtering apparatus used for forming the seed film 66. As such a sputtering apparatus, for example, a sputtering apparatus using inductively coupled plasma (ICP) may be employed.

Figure 5E:
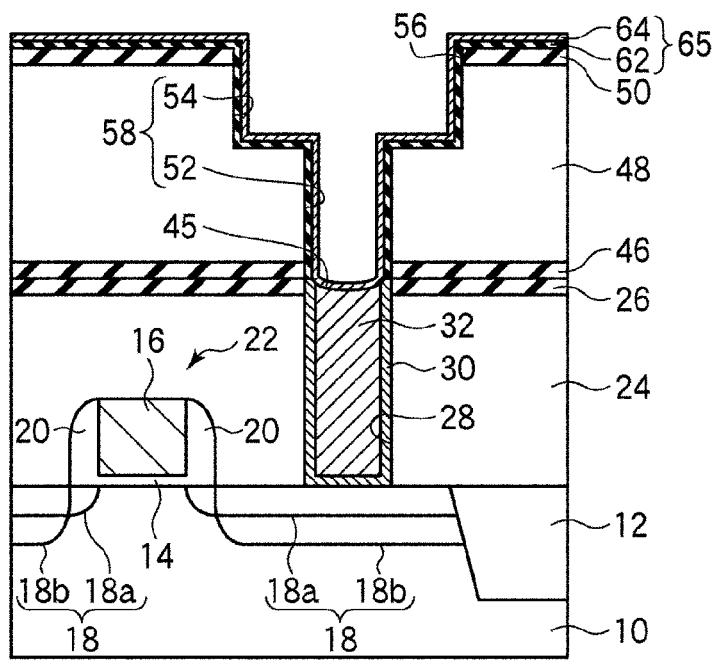

Next, as shown in FIG. 5E, a Zr film 64 is formed over the entire surface, for example, by sputtering. The thickness of the Zr film 64 is, for example, about 3 nm. The deposition conditions for the Zr film 64 are, for example, as follows. The target power is, for example, about 10 to 20 kW. The substrate bias is, for example, about 0 to 200 W. The Zr film 64 contributes to ensuring adhesion of the conductor plug 70a and the interconnect line 70b to the base. Furthermore, because of its good conductivity, the Zr film 64 contributes to a reduction in contact resistance between the conductor plug 70a and the conductor plug 32.

Thereby, a barrier film 65 including the zirconium oxide film 62 and the Zr film 64 is formed.

Figure 5F:
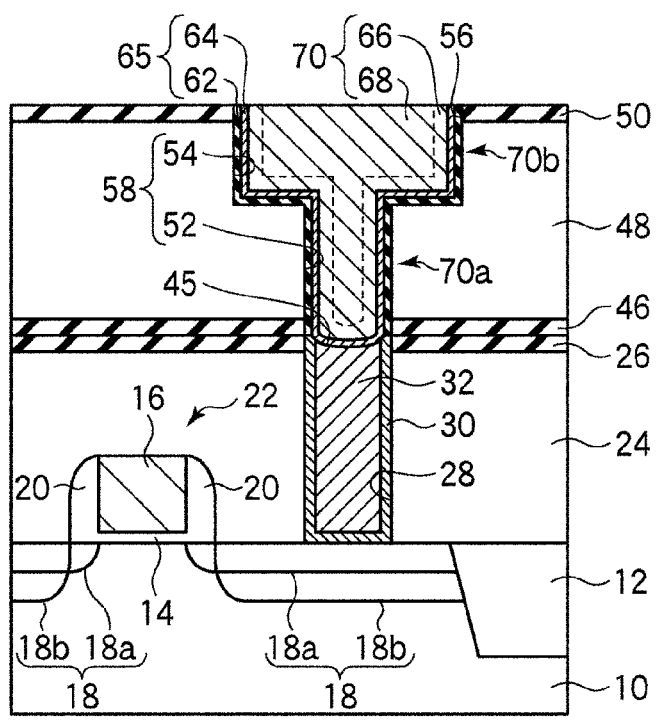

Next, the step of forming the seed film 66 to the step of embedding a conductor 70 into the opening 58 are carried out in the same manner as in the method for manufacturing the semiconductor device according to the first embodiment described above with reference to FIGS. 2J to 2L, and thus descriptions thereof are omitted (refer to FIG. 5F).

Figure 5G:
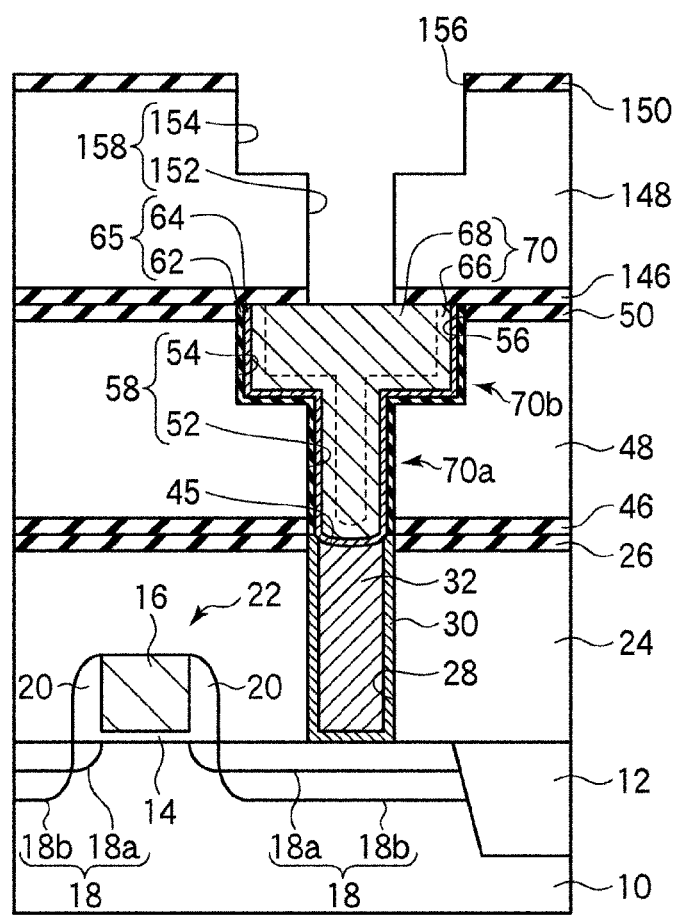

Next, the step of forming a cap film 146 to the step of forming an opening 158 are carried out in the same manner as in the method for manufacturing the semiconductor device according to the first embodiment described above with reference to FIGS. 2M and 2N, and thus descriptions thereof are omitted (refer to FIG. 5G).

Figure 5H:
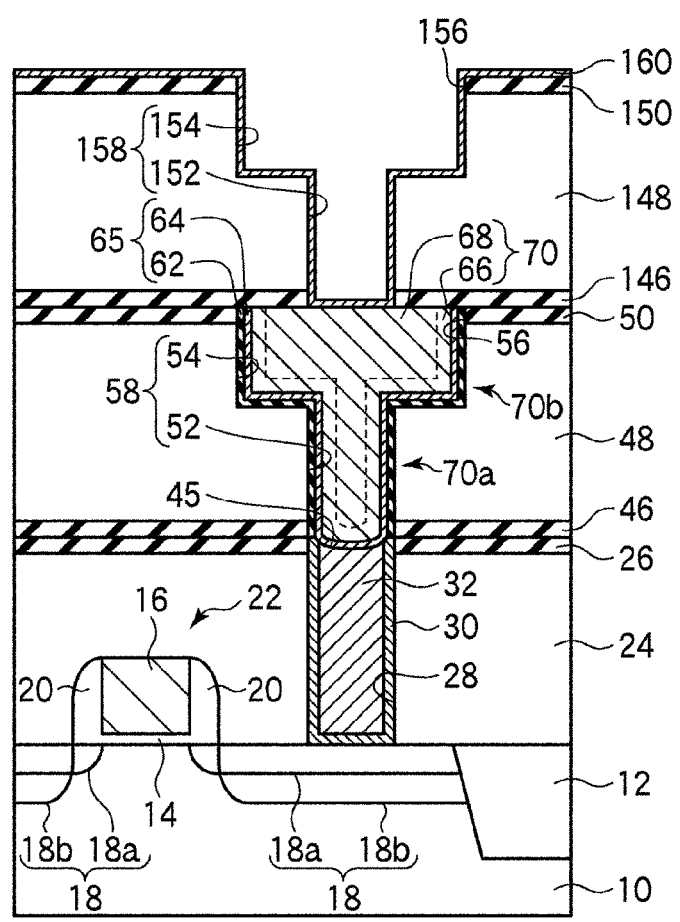
Figure 5I:
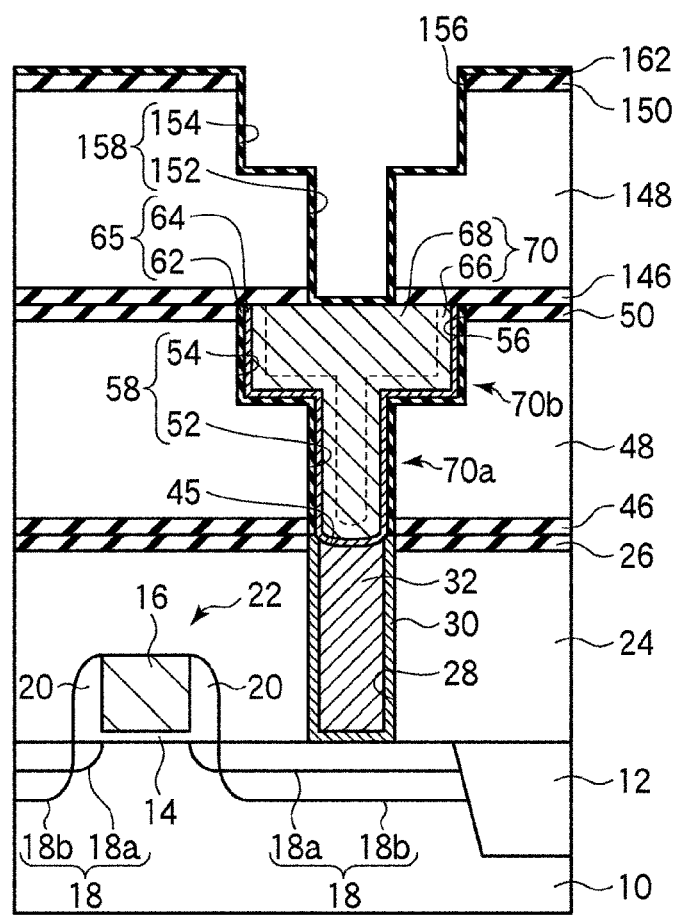

Next, a zirconium film 160 is formed over the entire surface as in the method for manufacturing the semiconductor device described above with reference to FIG. 2O (refer to FIG. 5H).

Next, the Zr film 160 is oxidized as in the method for manufacturing the semiconductor device described above with reference to FIG. 2P. Thereby, the Zr film 160 is oxidized to form a zirconium oxide film 162 (refer to FIG. 5I).

Figure 5J:
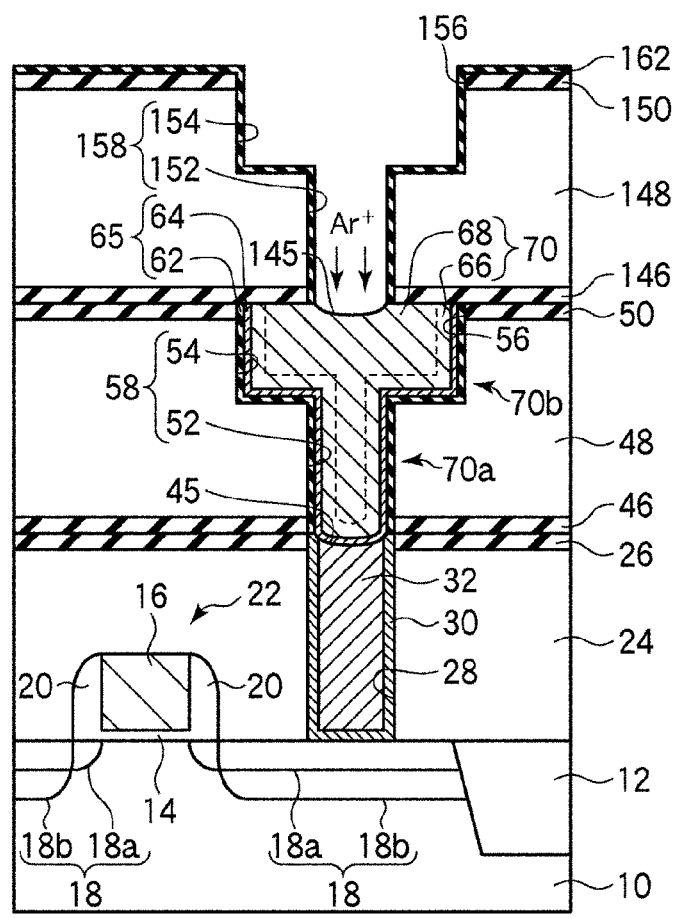

Next, as shown in FIG. 5J, for example, using Ar ions, the zirconium oxide film 162 at the bottom of the contact hole 152 is selectively removed by etching. When the zirconium oxide film 162 at the bottom of the contact hole 152 is selectively removed by etching, a sputtering apparatus used for forming a seed film 166, which will be described below, can be used. The target power is set, for example, at about 0 to 500 W. The substrate bias is set, for example, at 200 to 400 W. By using such conditions, Ar ions are concentrated at the bottom of the contact hole 152, and thus the zirconium oxide film 162 at the bottom of the contact hole 162 can be selectively removed. Since the zirconium oxide film 162 at the bottom of the contact hole 152 is removed, good contact can be achieved.

Since the bottom surface of the trench 154 is sufficiently large compared with the bottom surface of the contact hole 152, Ar ions are not concentrated at the bottom of the trench 154. Therefore, the zirconium oxide film 162 present at the bottom surface of the trench 154 is hardly etched by Ar ions. Consequently, the zirconium oxide film 162 at the bottom surface of the trench 154 does not disappear.

The zirconium oxide film 162 at the bottom of the contact hole 152 may be selectively removed by etching using a different sputtering apparatus from the sputtering apparatus used for forming the seed film 166. As such a sputtering apparatus, for example, a sputtering apparatus using inductively coupled plasma (ICP) may be employed.

Figure 5K:
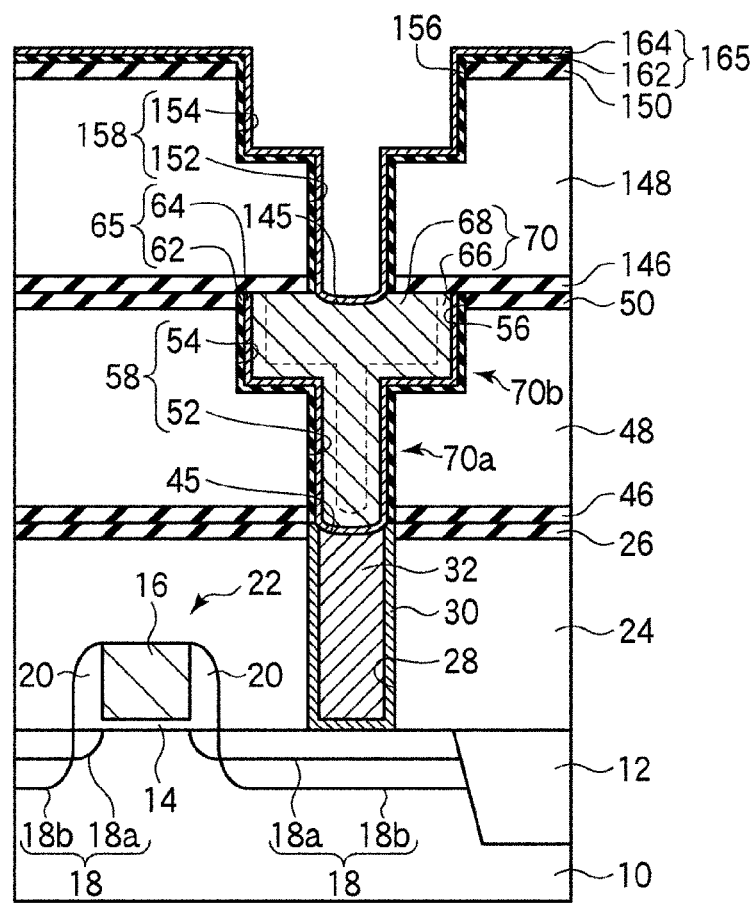

Next, as shown in FIG. 5K, a Zr film 164 is formed over the entire surface, for example, by sputtering. The thickness of the Zr film 164 is, for example, about 3 nm. The deposition conditions for the Zr film 164 are, for example, as follows. The target power is, for example, about 10 to 20 kW. The substrate bias is, for example, about 0 to 200 W. The Zr film 164 contributes to ensuring adhesion of the conductor plug 170a and the interconnect line 170b to the base. Furthermore, because of its good conductivity, the Zr film 164 contributes to a reduction in contact resistance between the conductor plug 170a and the underlying interconnect line 70b.

Thereby, a barrier film 165 including the zirconium oxide film 162 and the Zr film 164 is formed.

Next, the step of forming the seed film 166 to the step of embedding a conductor 170 into the opening 158 are carried out in the same manner as in the method for manufacturing the semiconductor device according to the first embodiment described above with reference to FIGS. 2R to 2T, and thus descriptions thereof are omitted.

Figure 5L:
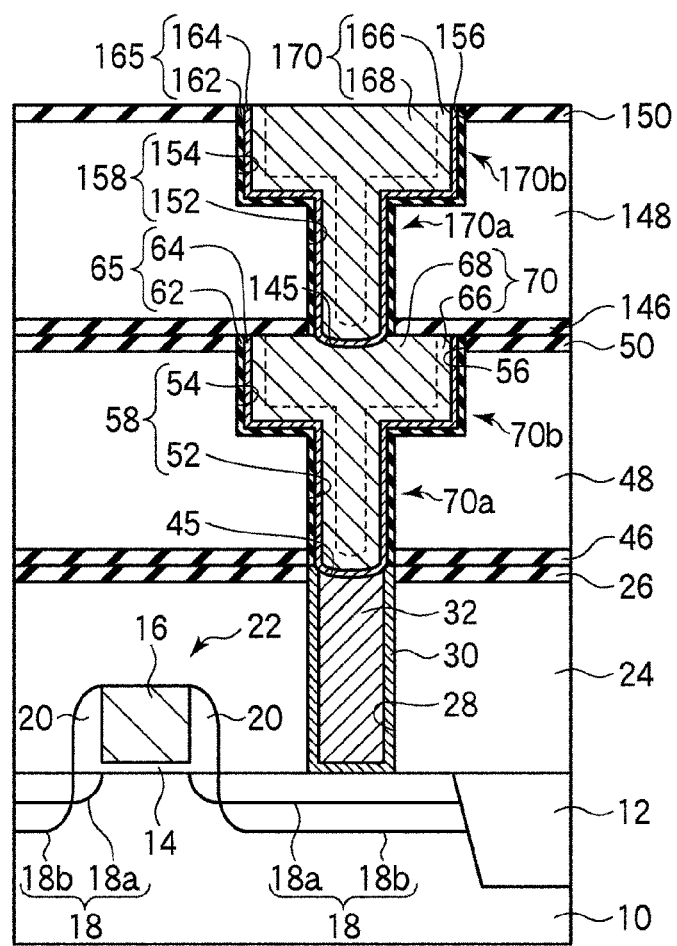

Thereby, a semiconductor device according to this embodiment is produced (refer to FIG. 5L).

Modified Example

A modified example of a method for manufacturing a semiconductor device according to this embodiment will now be described with reference to FIGS. 6A to 6J. FIGS. 6A to 6J are cross-sectional views showing the steps in a method for manufacturing a semiconductor device according to the modified example.

The method for manufacturing the semiconductor device according to the modified example is mainly characterized in that a zirconium oxide film 62 is directly formed on an interlayer insulation film 48 provided with an opening 58, and a zirconium oxide film 162 is directly formed on an interlayer insulation film 148 provided with an opening 158.

Figure 6A:
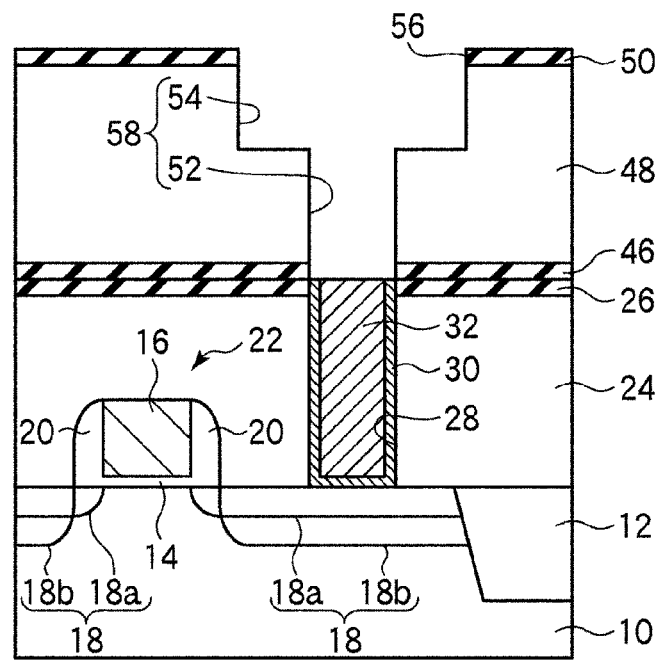
FIGS. 6A to 6J are cross-sectional views showing the steps in a method for manufacturing a semiconductor device according to a modified example of the second embodiment.

The method according to the modified example is the same, up to the step of forming the opening 58 in the interlayer insulation film 48, as the method for manufacturing the semiconductor device according to the first embodiment described above with reference to FIGS. 2A to 2F, and thus descriptions thereof are omitted (refer to FIG. 6A).

Figure 6B:
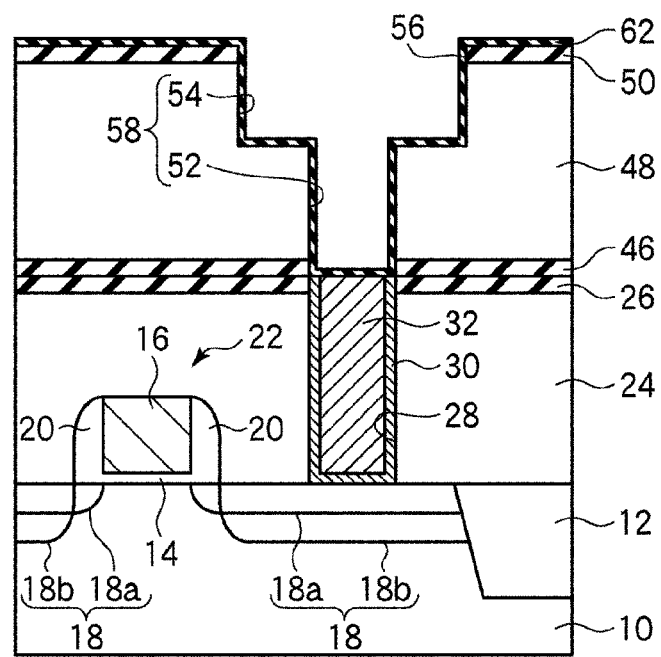

Next, the zirconium oxide film 62 is directly formed by sputtering in an oxygen-containing atmosphere as in the method for manufacturing the semiconductor device described above with reference to FIG. 4B (refer to FIG. 6B).

Figure 6C:
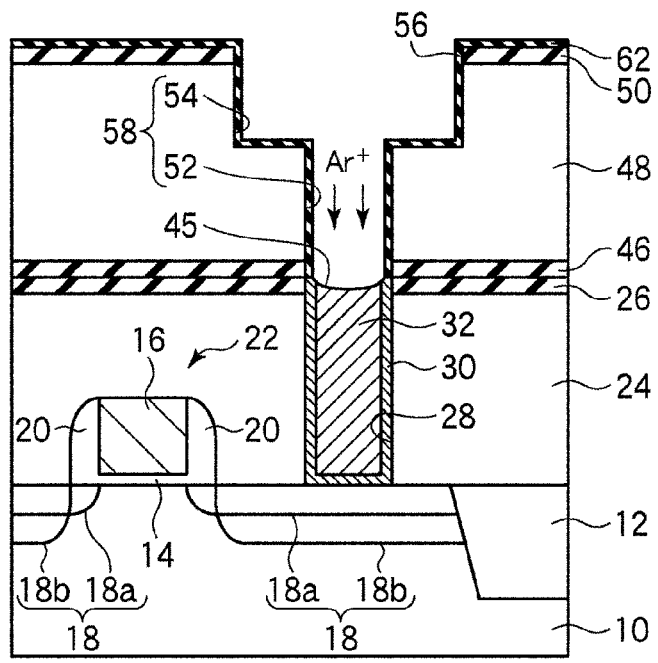

Next, the zirconium oxide film 62 at the bottom of the contact hole 52 is removed by etching using Ar ions as in the method for manufacturing the semiconductor device described above with reference to FIG. 5D (refer to FIG. 6C).

Next, the Zr film 64 is formed as in the method for manufacturing the semiconductor device described above with reference to FIG. 5E.

Figure 6D:
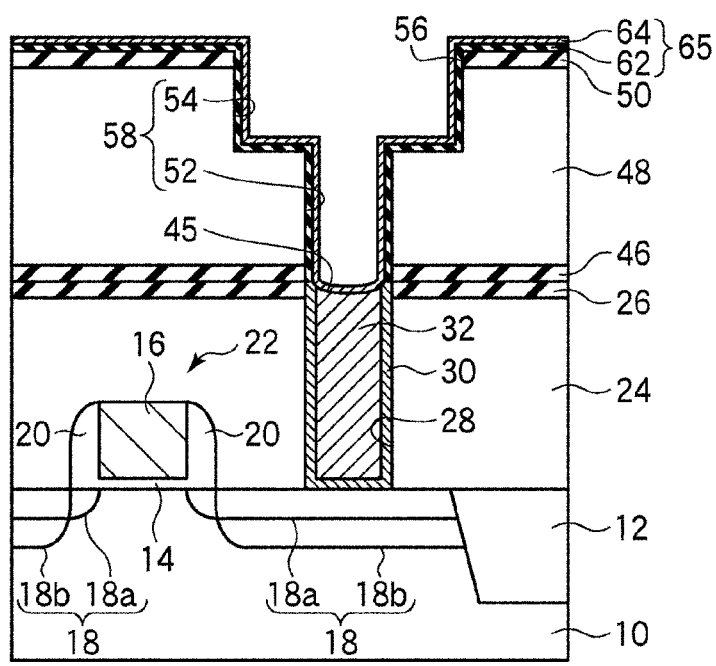

Thereby, a barrier film 65 including the zirconium oxide film 62 and the Zr film 64 is formed (refer to FIG. 6D).

Figure 6E:
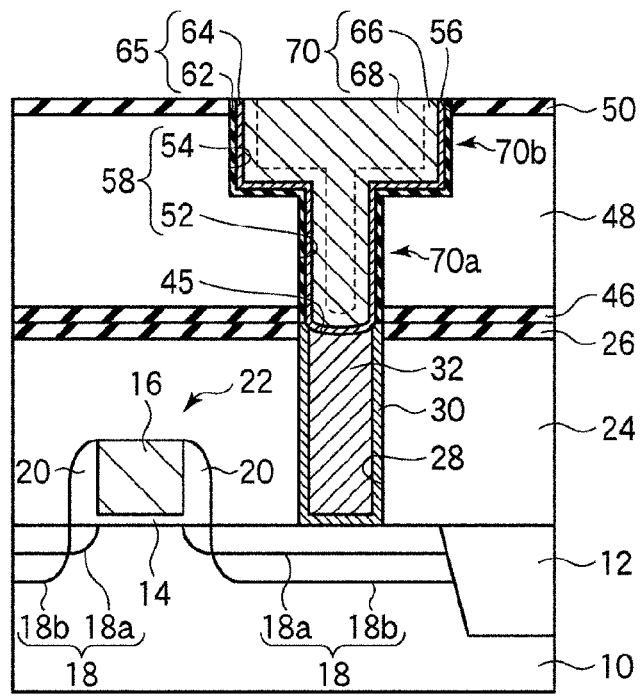

Next, the step of forming a seed film 66 to the step of embedding a conductor 70 into the opening 58 are carried out in the same manner as in the method for manufacturing the semiconductor device according to the first embodiment described above with reference to FIGS. 2J to 2L, and thus descriptions thereof are omitted (refer to FIG. 6E).

Figure 6F:
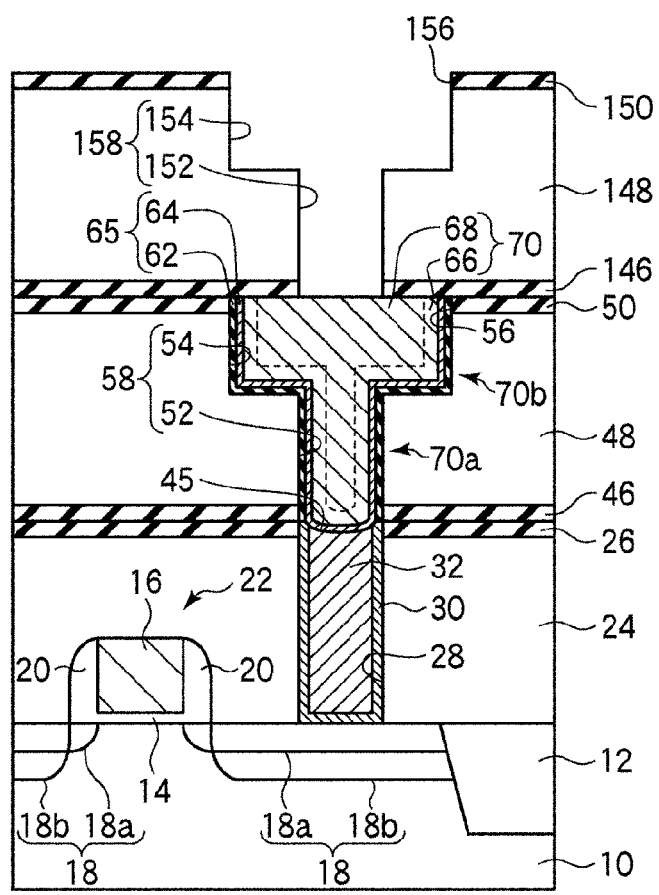

Next, the step of forming a cap film 146 to the step of forming an opening 158 are carried out in the same manner as in the method for manufacturing the semiconductor device according to the first embodiment described above with reference to FIGS. 2M and 2N, and thus descriptions thereof are omitted (refer to FIG. 6F).

Figure 6G:
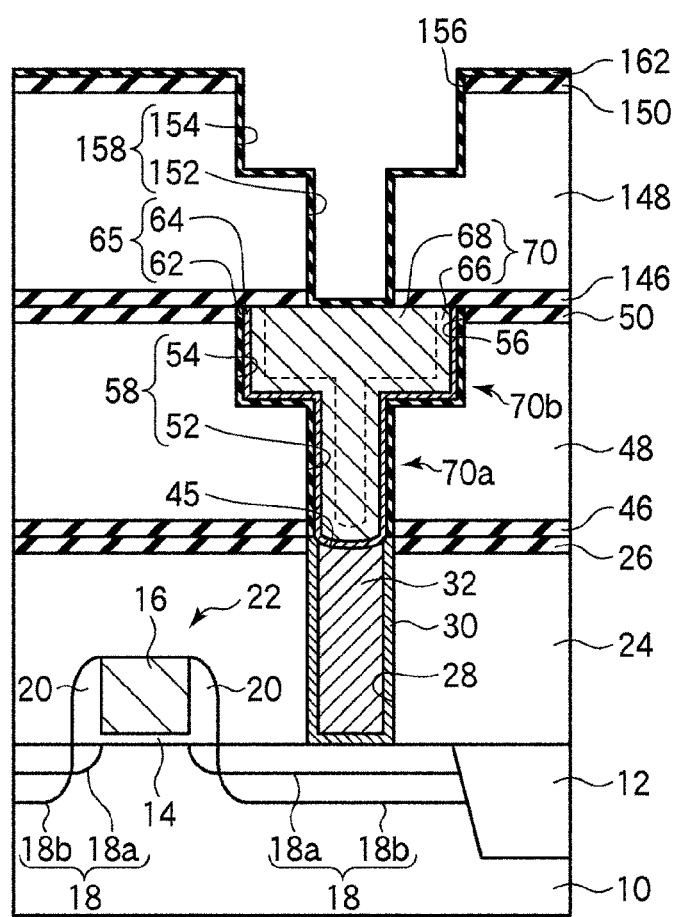

Next, the zirconium oxide film 162 is formed by sputtering in an oxygen-containing atmosphere as in the method for manufacturing the semiconductor device described above with reference to FIG. 4F (refer to FIG. 6G).

Figure 6H:
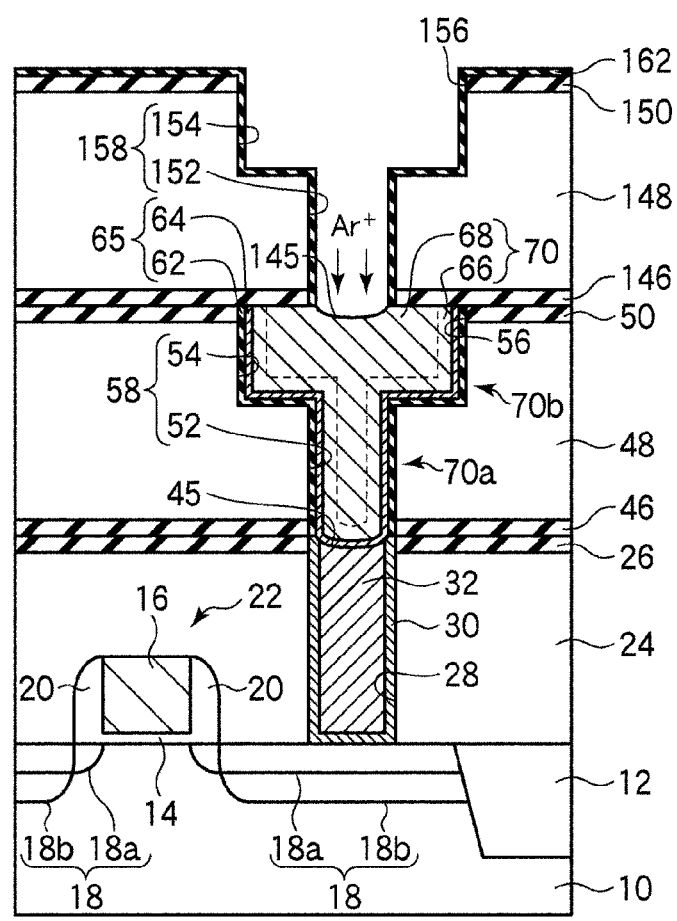

Next, the zirconium oxide film 162 at the bottom of the contact hole 152 is removed by etching using Ar ions as in the method for manufacturing the semiconductor device described above with reference to FIG. 5J (refer to FIG. 6H).

Next, a Zr film 164 is formed as in the method for manufacturing the semiconductor device described above with reference to FIG. 5K.

Figure 6I:
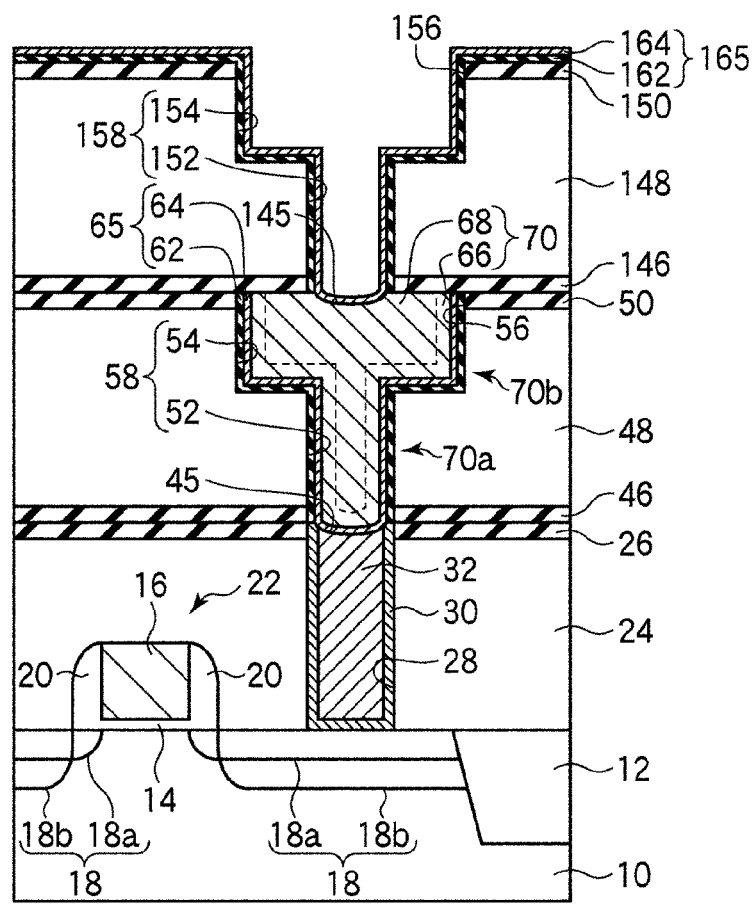

Thereby, a barrier film 165 including the zirconium oxide film 162 and the Zr film 164 is formed (refer to FIG. 6I).

Next, the step of forming a seed film 166 to the step of embedding a conductor 170 into the opening 158 are carried out in the same manner as in the method for manufacturing the semiconductor device according to the first embodiment described above with reference to FIGS. 2R to 2T, and thus descriptions thereof are omitted.

Figure 6J:
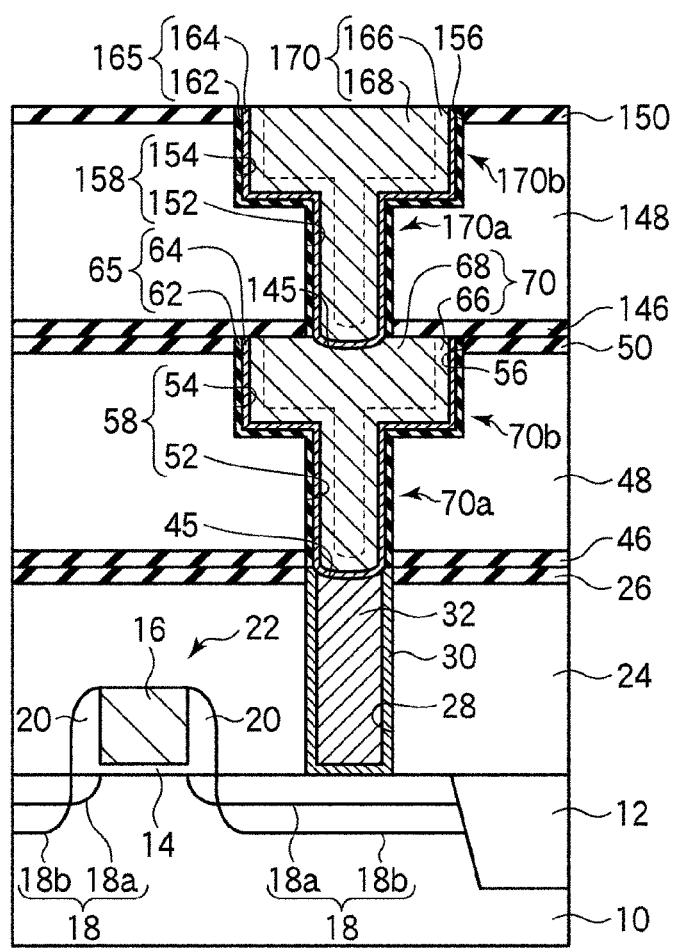

Thereby, a semiconductor device according to the modified example is produced (refer to FIG. 6J). As described above, the zirconium oxide film 62 may be directly formed on the interlayer insulation film 48 provided with the opening 58, and the zirconium oxide film 162 may be directly formed on the interlayer insulation film 148 provided with the opening 158.

Third Embodiment

A semiconductor device and a method for manufacturing the same according to a third embodiment of the present invention will now be described with reference to FIGS. 7 to 8E. The same reference numerals are used for the same constitutional elements as those for the semiconductor device and the method for manufacturing the same according to the first or second embodiment shown in FIGS. 1 to 6J, and descriptions thereof are omitted or simplified.

(Semiconductor Device)

First, a semiconductor device according to this embodiment will be described with reference to FIG. 7. FIG. 7 is a cross-sectional view of the semiconductor device according to this embodiment.

The semiconductor device according to this embodiment is mainly characterized in that the lower portion of the conductor plug 170a is directly connected to the underlying interconnect line 70b.

Figure 7:
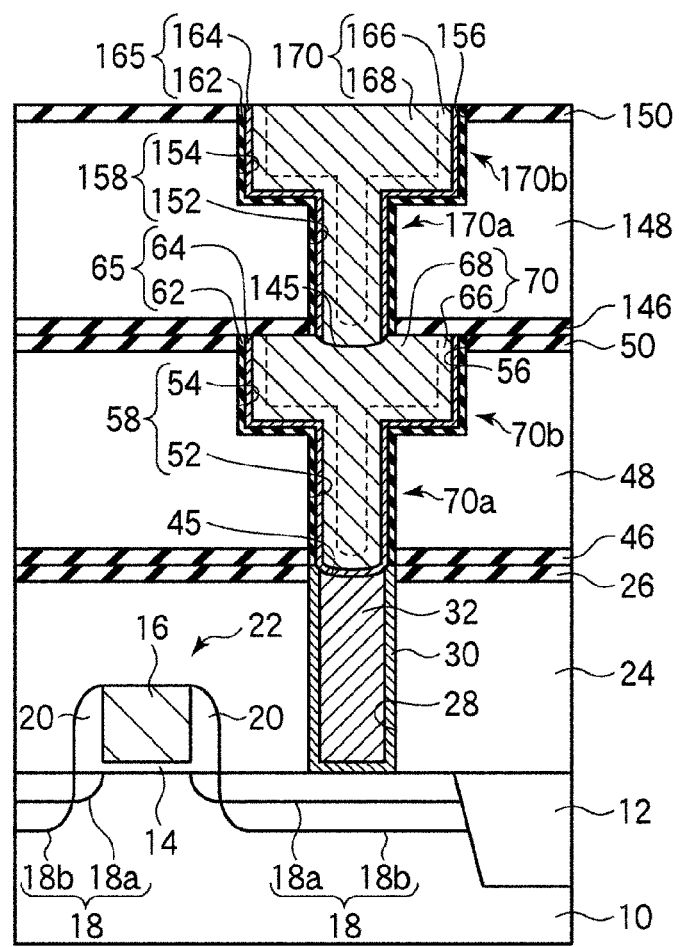
FIG. 7 is a cross-sectional view of a semiconductor device according to a third embodiment.

As shown in FIG. 7, a zirconium oxide film 162 is disposed in an opening 158. The zirconium oxide film 162 is disposed on the side surface of a contact hole 152 and the side surface and the bottom surface of a trench 154. The zirconium oxide film 162 at the bottom of the contact hole 152 is selectively removed.

A zirconium film 164 is disposed in the opening 158 provided with the zirconium oxide film 162. The Zr film 164 is disposed on the side surface of the contact hole 152 and the side surface and the bottom surface of the trench 154. The Zr film 164 at the bottom of the contact hole 152 is selectively removed. The Zr film 164 contributes to ensuring adhesion of the conductor plug 170a and the interconnect line 170b to the base.

Thus, a barrier film 165 including the zirconium oxide film 162 and the Zr film 164 is provided.

A seed film 166 composed of Cu is disposed in the opening 158 provided with the barrier film 165. The thickness of the seed film 166 is, for example, about 30 nm.

A Cu film 168 is embedded into the opening 158 provided with the seed film 166.

Thus, a conductor 170 including the seed film 166 composed of Cu and the Cu film 168 is embedded into the opening 158. That is, the conductor 170 having the conductor plug 170a and the interconnect line 170b integrally formed with the conductor plug 170a is embedded into the opening 158. The lower portion of the conductor plug 170a is directly connected to the underlying interconnect line 70b.

An interconnect line (not shown) is further disposed on the cap film 150 embedded with the conductor plug 170a and the interconnect line 170b.

A semiconductor device having a multilayer interconnection structure according to this embodiment has the structure described above.

As described above, according to this embodiment, the lower portion of the conductor plug 170a is directly connected to the underlying interconnect line 70b. Consequently, according to this embodiment, a very good contact can be obtained between the conductor plug 170a and the underlying interconnect line 70b.

(Method for Manufacturing Semiconductor Device)

A method for manufacturing a semiconductor device according to this embodiment will now be described with reference to FIGS. 8A to 8E. FIGS. 8A to 8E are cross-sectional views showing the steps in the method for manufacturing a semiconductor device according to this embodiment.

Figure 8A:
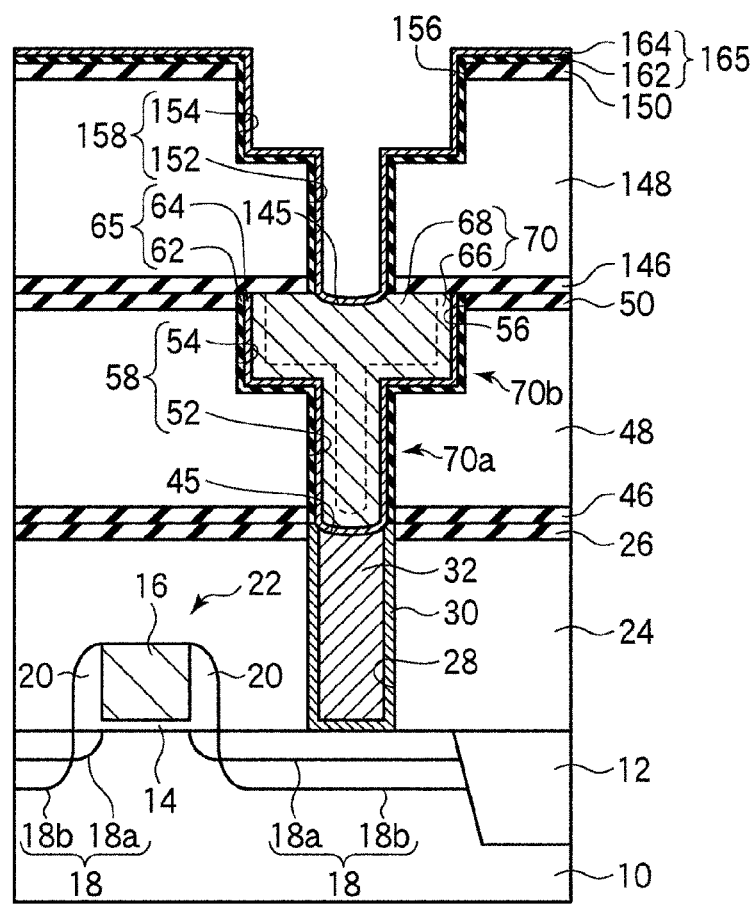
FIGS. 8A to 8E are cross-sectional views showing the steps in a method for manufacturing a semiconductor device according to the third embodiment.

First, the step of forming an element isolation region 12 in a semiconductor substrate 10 to the step of forming a barrier film 165 are carried out in the same manner as in the method for manufacturing the semiconductor device according to the first embodiment described above with reference to FIGS. 2A to 2Q, and thus descriptions thereof are omitted (refer to FIG. 8A).

Figure 8B:
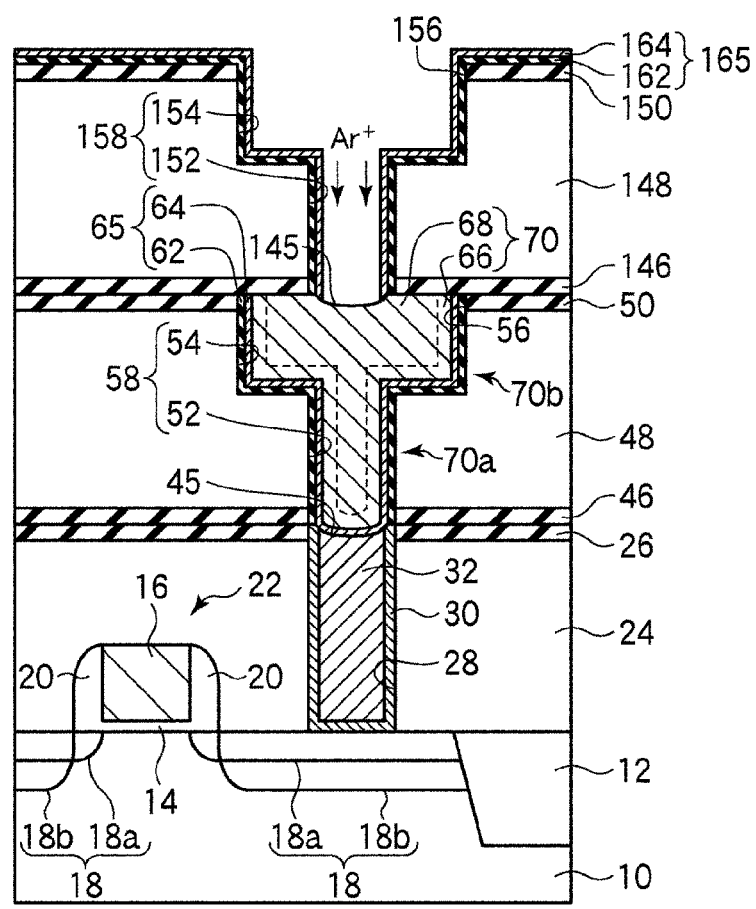

Next, as shown in FIG. 8B, for example, using Ar ions, the Zr film 164 at the bottom of the contact hole 152 is selectively removed by etching. When the Zr film 164 at the bottom of the contact hole 152 is selectively removed by etching, a sputtering apparatus used for forming a seed film 166, which will be described below, can be used. The target power is set, for example, at about 0 to 500 W. The substrate bias is set, for example, at 200 to 400 W. By using such conditions, Ar ions are concentrated at the bottom of the contact hole 152, and thus the Zr film 164 at the bottom of the contact hole 152 can be selectively removed.

Since the bottom surface of the trench 154 is sufficiently large compared with the bottom surface of the contact hole 152, Ar ions are not concentrated at the bottom of the trench 154. Therefore, the Zr film 164 and the zirconium oxide film 162 present at the bottom surface of the trench 154 are hardly etched by Ar ions. Consequently, the Zr film 164 and the zirconium oxide film 162 at the bottom surface of the trench 154 do not disappear.

The Zr film 164 at the bottom of the contact hole 152 may be selectively removed by etching using a different sputtering apparatus from the sputtering apparatus used for forming the seed film 166. As such a sputtering apparatus, for example, a sputtering apparatus using inductively coupled plasma (ICP) may be employed.

Figure 8C:
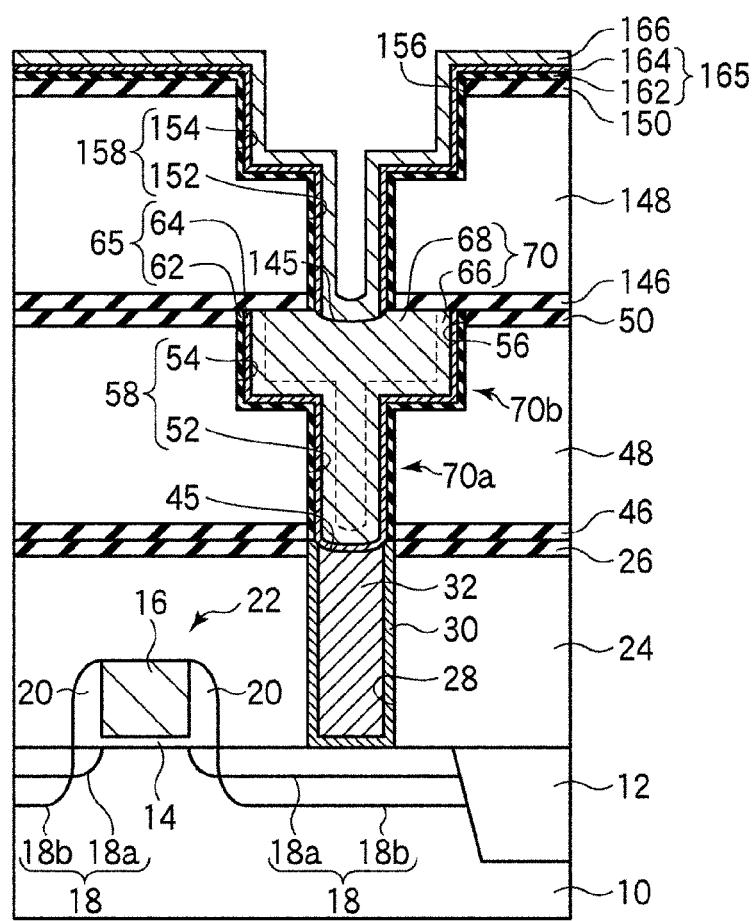
Figure 8D:
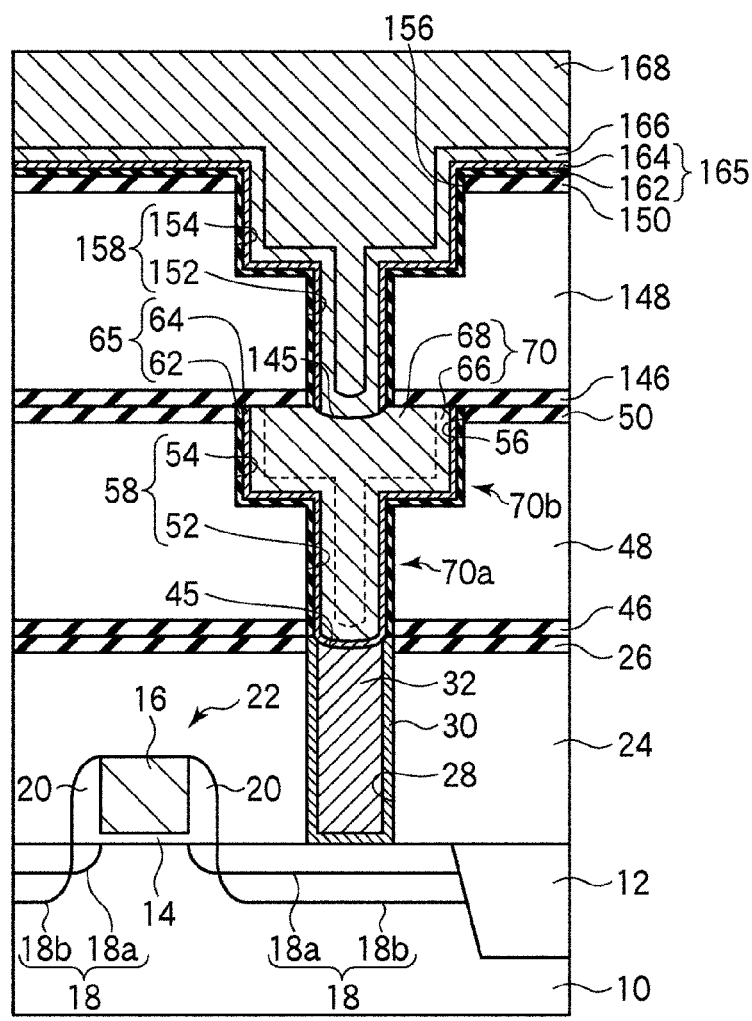
Figure 8E:
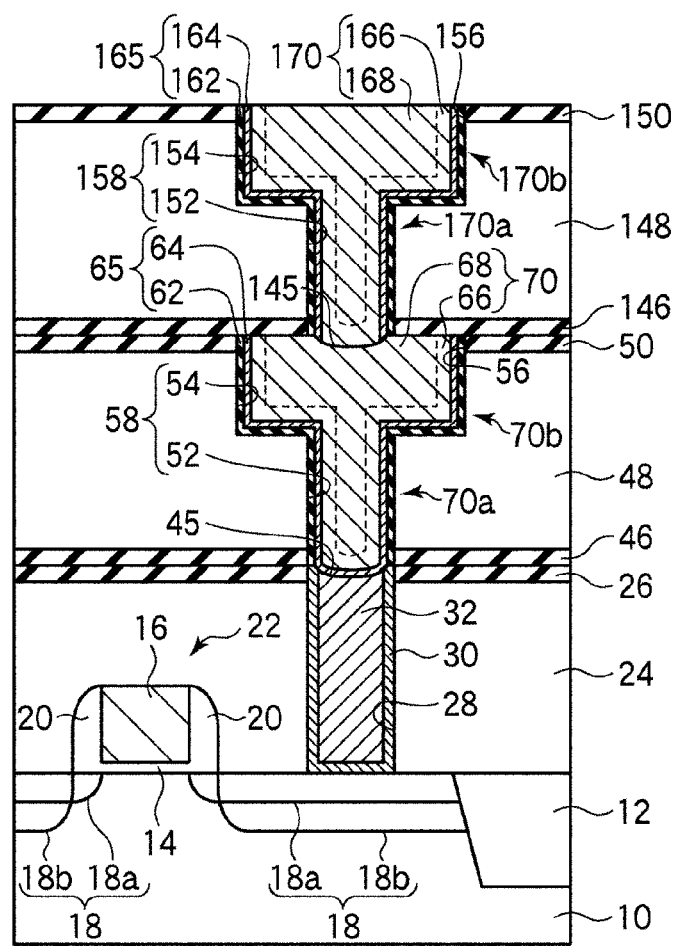

Next, the step of forming the seed film 166 composed of Cu to the step of embedding a conductor plug 170*a* and an interconnect line 170*b* into the opening 154 are carried out as in the method for manufacturing the semiconductor device according to the first embodiment described above with reference to FIGS. 2R to 2T, and thus descriptions thereof are omitted (refer to FIGS. 8C to 8E).

Then, an interconnect line (not shown) is further formed.

Thereby, a semiconductor device having a multilayer interconnection structure according to this embodiment is produced.

As described above, according to this embodiment, since the lower portion of the conductor plug 170*a* is directly connected to the underlying interconnect line 70*b*, a very good contact can be obtained between the conductor plug 170*a* and the underlying interconnect line 70*b*.

Fourth Embodiment

A method for manufacturing a semiconductor device according to a fourth embodiment of the present invention will now be described with reference to FIGS. 9A to 9G. FIGS. 9A to 9G are cross-sectional views showing the steps in the method for manufacturing a semiconductor device according to this embodiment. The same reference numerals are used for the same constitutional elements as those for the semiconductor device and the method for manufacturing the same according to any of the first to third embodiments shown in FIGS. 1 to 8E, and descriptions thereof are omitted or simplified.

Figure 9A:
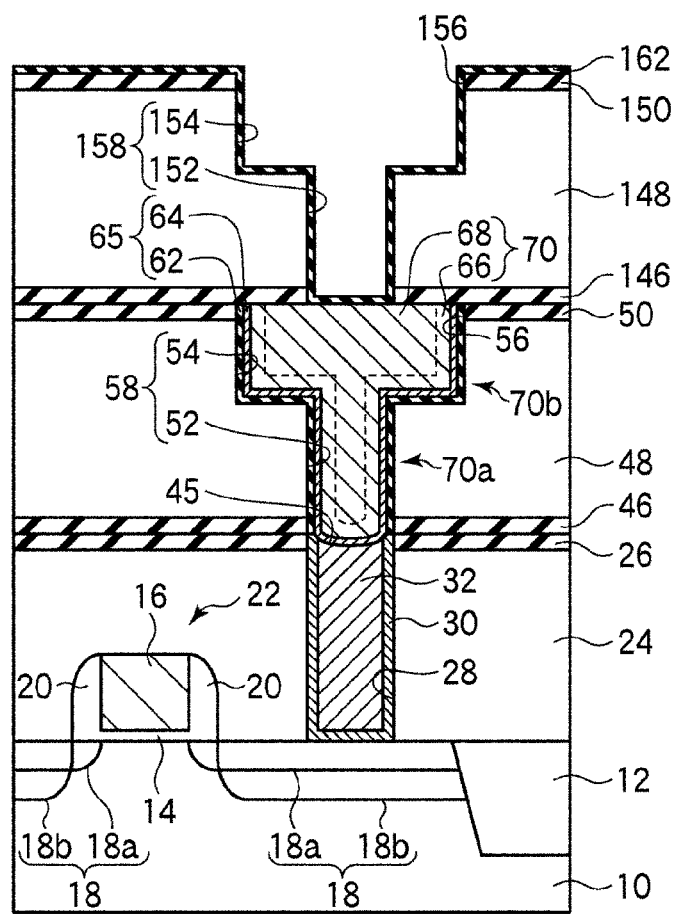
FIGS. 9A to 9G are cross-sectional views showing the steps in a method for manufacturing a semiconductor device according to a fourth embodiment.

First, the step of forming an element isolation region 12 in a semiconductor substrate 10 to the step of forming a zirconium oxide film 162 are carried out in the same manner as in the method for manufacturing the semiconductor device according to the first embodiment described above with reference to FIGS. 2A to 2P, and thus descriptions thereof are omitted (refer to FIG. 9A).

Figure 9B:
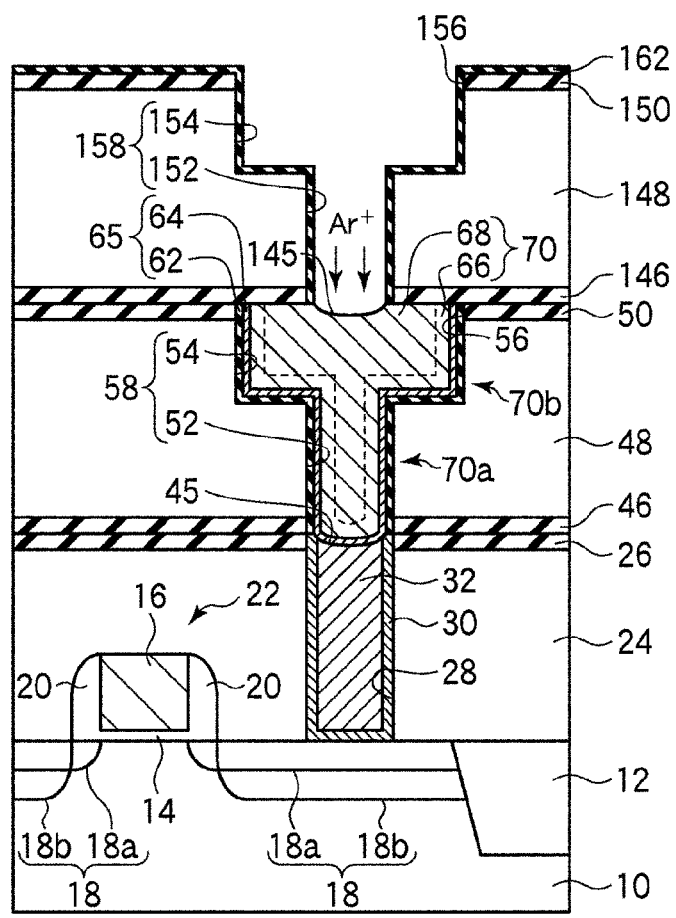

Next, for example, using Ar ions, the zirconium oxide film 162 at the bottom of the contact hole 152 is selectively removed by etching as in the method for manufacturing the semiconductor device according to the second embodiment described above with reference to FIG. 5J (refer to FIG. 9B).

Next, a Zr film 164 is formed over the entire surface as in the method for manufacturing the semiconductor device according to the second embodiment described above with reference to FIG. 5K.

Figure 9C:
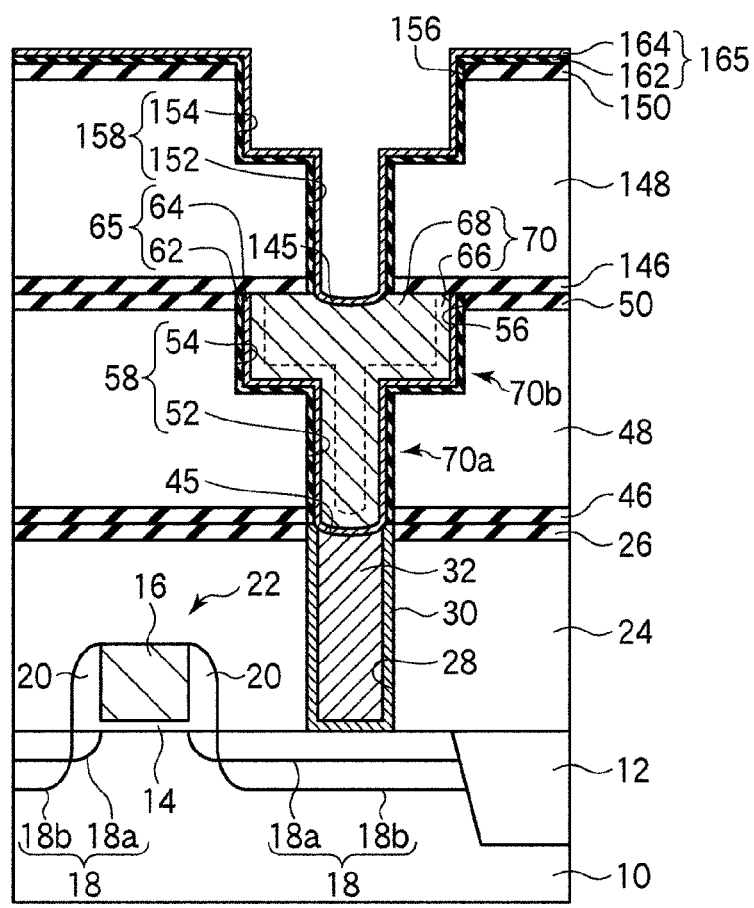

Thereby, a barrier film 165 including the zirconium oxide film 162 and the Zr film 164 is formed (refer to FIG. 9C).

Figure 9D:
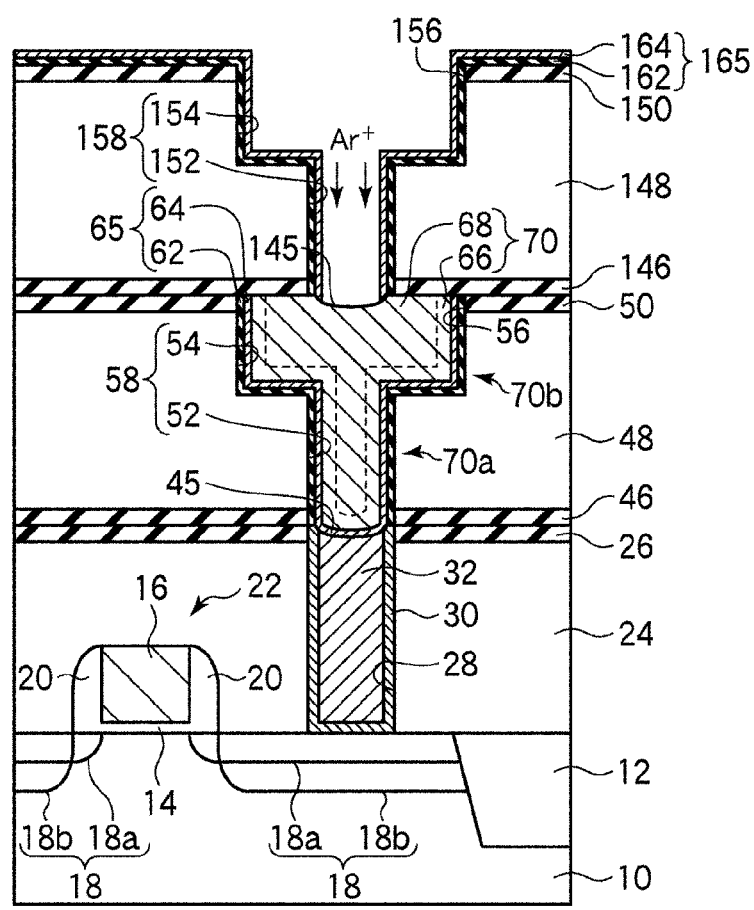

Next, for example, using Ar ions, the Zr film 164 at the bottom of the contact hole 152 is selectively removed by etching as in the method for manufacturing the semiconductor device according to the third embodiment described above with reference to FIG. 8B (refer to FIG. 9D).

Figure 9E:
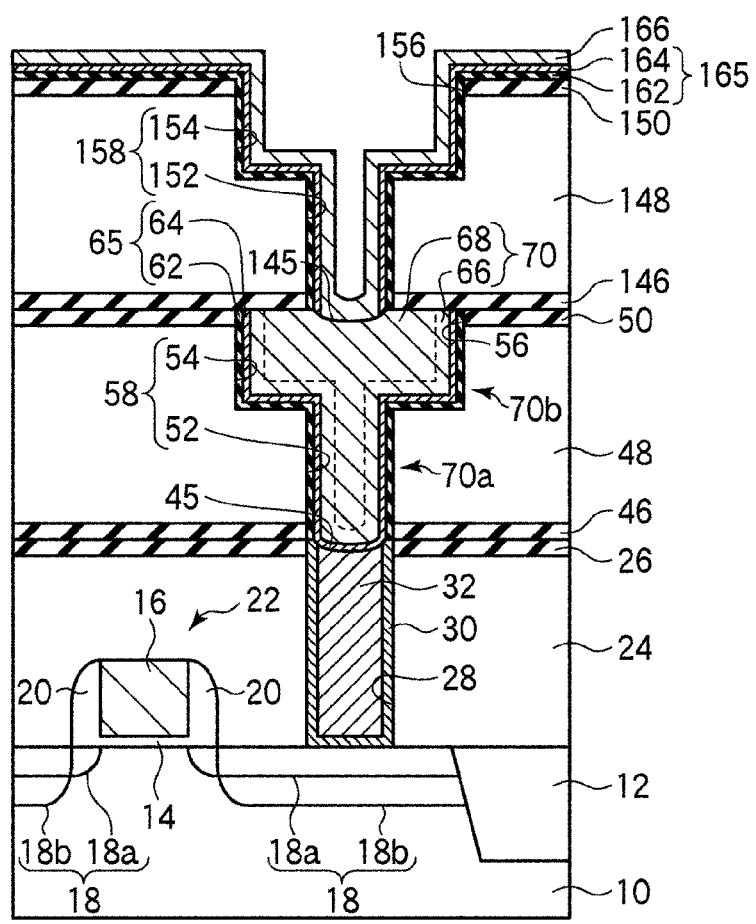
Figure 9F:
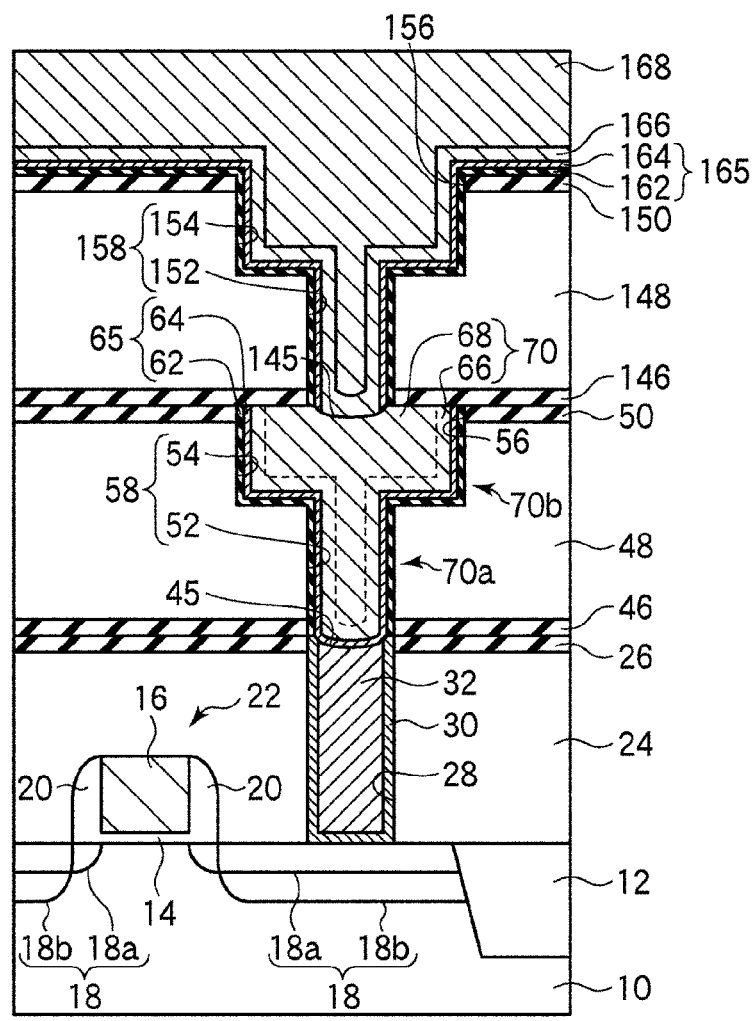
Figure 9G:
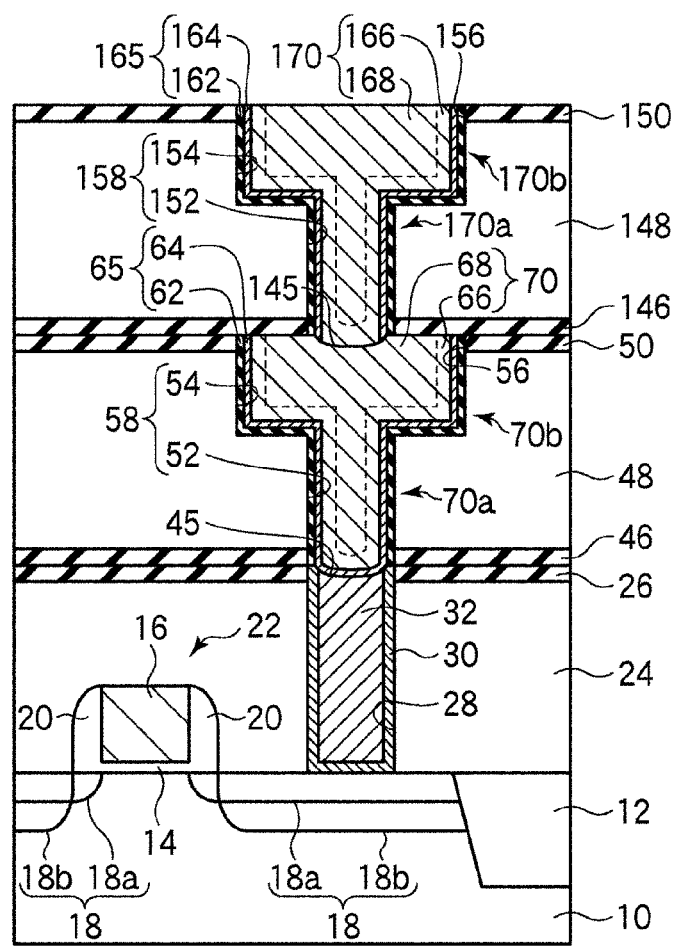

Next, the step of forming a seed film 166 composed of Cu to the step of embedding a conductor 170 into the opening 158 are carried out in the same manner as in the method for manufacturing the semiconductor device according to the first embodiment described above with reference to FIGS. 2R to 2T, and thus descriptions thereof are omitted (refer to FIGS. 9E to 9G).

Then, an interconnect line (not shown) is further formed.

Thereby, a semiconductor device having a multilayer interconnection structure according to this embodiment is produced.

As described above, according to this embodiment, since the lower portion of the conductor plug 170*a* is directly connected to the underlying interconnect line 70*b*, a very good contact can be obtained between the conductor plug 170*a* and the underlying interconnect line 70*b*.

Modified Embodiments

The present invention is not limited to the embodiments described above, and various modifications are possible.

For example, in each of the third and fourth embodiments, the example in which after the Zr film 60 is formed, by oxidizing the Zr film 60, the zirconium oxide film 62 is formed has been described. However, the zirconium oxide film 62 may be directly formed as in the method for manufacturing the semiconductor device described above with reference to FIG. 6B.

Furthermore, in each of the third and fourth embodiments, the example in which after the Zr film 160 is formed, by oxidizing the Zr film 160, the zirconium oxide film 162 is formed has been described. However, the zirconium oxide film 162 may be directly formed as in the method for manufacturing the semiconductor device described above with reference to FIG. 6G.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device, comprising:

forming a first conductor on a semiconductor substrate;

forming an oxygen-containing insulation film on the first conductor;

forming a contact hole extended through the oxygen-containing insulation film to an upper portion of the first conductor in the oxygen-containing insulation film;

forming a zirconium oxide film inside the contact hole;

forming a zirconium film on the zirconium oxide film inside the contact hole while selectively removing the zirconium oxide film at a bottom of the contact hole; and embedding a second conductor into the contact hole.

2. A method for manufacturing a semiconductor device, comprising:
forming a first conductor on a semiconductor substrate;
forming an oxygen-containing insulation film on the first conductor;
forming a contact hole extended through the oxygen-containing insulation film to an upper portion of the first conductor in the oxygen-containing insulation film;
forming a zirconium oxide film inside the contact hole;
selectively removing the zirconium oxide film at a bottom of the contact hole;
forming a zirconium film on the zirconium oxide film inside the contact hole; and
embedding a second conductor into the contact hole.

3. The method for manufacturing a semiconductor device according to claim 1, further comprising,
forming a trench in the oxygen-containing insulation film connecting to an upper portion of the contact hole.

4. The method for manufacturing a semiconductor device according to claim 1, wherein the first conductor includes a first conductor plug or a first interconnect line.

5. The method for manufacturing a semiconductor device according to claim 1, wherein, in embedding the second conductor, a second conductor plug is embedded into the contact hole, and a second interconnect line is embedded into the trench.

6. The method for manufacturing a semiconductor device according to claim 1, further comprising, after forming the zirconium film and before embedding the second conductor, removing the zirconium film at the bottom of the contact hole, wherein, in embedding the second conductor, the second conductor is embedded so as to be in contact with the first conductor.

7. The method for manufacturing a semiconductor device according to claim 1, wherein, in forming the zirconium oxide film, the zirconium oxide film is formed by sputtering in an oxygen-containing atmosphere.

8. The method for manufacturing a semiconductor device according to claim 1, wherein forming the zirconium oxide film includes:
a first step of forming another zirconium film; and
a second step of forming the zirconium oxide film by oxidizing the other zirconium film.

9. The method for manufacturing a semiconductor device according to claim 8, wherein, in the second step of forming the zirconium oxide film, the zirconium oxide film is formed by subjecting the other zirconium film to heat treatment in an oxygen-containing atmosphere.

10. The method for manufacturing a semiconductor device according to claim 1, wherein embedding the second conductor includes:
forming a seed film composed of Cu on the zirconium film inside the contact hole and inside the trench;
forming a Cu film by electroplating on the seed film; and
polishing the Cu film and the seed film until a surface of the oxygen-containing insulation film is exposed.

11. The method for manufacturing a semiconductor device according to claim 1, wherein the oxygen-containing insulation film is a porous insulation film.

* * * * *